US009362410B2

(12) United States Patent
Shibata et al.

(10) Patent No.: US 9,362,410 B2
(45) Date of Patent: Jun. 7, 2016

(54) SEMICONDUCTOR DEVICE, MANUFACTURING METHOD THEREOF, AND DISPLAY DEVICE

(71) Applicant: SEMICONDUCTOR ENERGY LABORATORY CO., LTD., Atsugi-shi, Kanagawa-ken (JP)

(72) Inventors: Hiroshi Shibata, Yamagata (JP); Shinji Maekawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/974,957

(22) Filed: Dec. 18, 2015

(65) Prior Publication Data
US 2016/0099356 A1 Apr. 7, 2016

Related U.S. Application Data

(60) Continuation of application No. 14/069,404, filed on Nov. 1, 2013, now Pat. No. 9,219,157, which is a continuation of application No. 11/790,741, filed on Apr. 27, 2007, now Pat. No. 8,575,696, which is a
(Continued)

(30) Foreign Application Priority Data

Jun. 1, 2001 (JP) .................................. 2001-166877
Jul. 31, 2001 (JP) .................................. 2001-230701
Nov. 30, 2001 (JP) .................................. 2001-367575

(51) Int. Cl.
*H01L 21/00* (2006.01)
*H01L 29/786* (2006.01)

(52) U.S. Cl.
CPC .... *H01L 29/78675* (2013.01); *H01L 29/78621* (2013.01); *H01L 29/78633* (2013.01); *H01L 29/78645* (2013.01)

(58) Field of Classification Search
CPC ................... H01L 29/78675; H01L 29/78633; H01L 29/78621
See application file for complete search history.

(56) References Cited

U.S. PATENT DOCUMENTS 4,759,610 A * 7/1988 Yanagisawa ...... G02F 1/136213
257/59
4,945,067 A 7/1990 Huang
(Continued)

FOREIGN PATENT DOCUMENTS

EP 1063049 A 12/2000
EP 1081676 A 3/2001
(Continued)

OTHER PUBLICATIONS
Hara.A et al., "Ultra-High Performance Poly-Si TFTs on a Glass by a Stable Scanning CW Laser Lateral Crystallization", AM-LCD '01 Digest of Technical Papers, 2001, pp. 227-230.

*Primary Examiner* — Laura Menz
(74) *Attorney, Agent, or Firm* — Nixon Peabody LLP; Jeffrey L. Costellia

(57) ABSTRACT

A multi-gate structure is used and a width (d1) of a high concentration impurity region sandwiched by two channel forming regions in a channel length direction is set to be shorter than a width (d2) of low concentration impurity regions in the channel length direction. Thus, a resistance of the entire semiconductor layer of a TFT which is in an on state is reduced to increase an on current. In addition, a carrier life time due to photoexcitation produced in the high concentration impurity region can be shortened to reduce light sensitivity.

17 Claims, 27 Drawing Sheets

Related U.S. Application Data division of application No. 11/134,401, filed on May 23, 2005, now Pat. No. 7,214,986, which is a division of application No. 10/157,046, filed on May 30, 2002, now Pat. No. 6,897,477.

(56) References Cited

U.S. PATENT DOCUMENTS

| | | | |
|---|---|---|---|
| 4,969,718 A * | 11/1990 | Noguchi et al. | G02F 1/133514 345/88 |
| 5,092,664 A * | 3/1992 | Miyatake | G02F 1/1396 348/E9.027 |
| 5,202,575 A | 4/1993 | Sakai | |
| 5,250,835 A | 10/1993 | Izawa | |
| 5,327,268 A | 7/1994 | Takabatake et al. | |
| 5,402,254 A * | 3/1995 | Sasano | G02F 1/1368 349/111 |
| 5,412,493 A | 5/1995 | Kunii et al. | |
| 5,608,251 A | 3/1997 | Konuma et al. | |
| 5,623,157 A | 4/1997 | Miyazaki et al. | |
| 5,712,495 A | 1/1998 | Suzawa | |
| 5,759,901 A | 6/1998 | Loh et al. | |
| 5,892,702 A * | 4/1999 | Okamoto | H01L 27/10852 257/308 |
| 5,929,464 A | 7/1999 | Yamazaki et al. | |
| 6,025,607 A | 2/2000 | Ohori et al. | |
| 6,124,199 A | 9/2000 | Gambino et al. | |
| 6,259,120 B1 | 7/2001 | Zhang et al. | |
| 6,278,131 B1 * | 8/2001 | Yamazaki | H01L 27/1237 257/347 |
| 6,306,709 B1 | 10/2001 | Miyagi et al. | |
| 6,437,284 B1 | 8/2002 | Okamoto et al. | |
| 6,448,579 B1 * | 9/2002 | Lim | H01L 29/04 257/59 |
| 6,448,612 B1 | 9/2002 | Miyazaki et al. | |
| 6,469,317 B1 | 10/2002 | Yamazaki et al. | |
| 6,542,205 B2 * | 4/2003 | Ohtani | G02F 1/136213 349/110 |
| 6,576,924 B1 * | 6/2003 | Yamazaki | G02F 1/13454 257/408 |
| 6,583,472 B1 | 6/2003 | Shibata et al. | |
| 6,590,229 B1 * | 7/2003 | Yamazaki | G02F 1/136213 257/71 |
| 6,620,667 B2 | 9/2003 | Kim et al. | |
| 6,639,265 B2 * | 10/2003 | Arao | G02F 1/13454 257/303 |
| 6,680,488 B2 * | 1/2004 | Shibata | G02F 1/136209 257/59 |
| 6,693,044 B1 | 2/2004 | Yamazaki et al. | |
| 6,720,577 B2 * | 4/2004 | Arao | G02F 1/133305 257/532 |
| 6,737,302 B2 * | 5/2004 | Arao | H01L 29/66757 257/E21.413 |
| 6,765,272 B2 | 7/2004 | Natsume | |
| 6,808,964 B2 | 10/2004 | Hayashi et al. | |
| 6,821,563 B2 | 11/2004 | Yudovsky | |
| 6,828,585 B2 | 12/2004 | Ueda | |
| 6,831,297 B2 | 12/2004 | Arao | |
| 6,870,222 B2 | 3/2005 | Kim et al. | |
| 6,876,038 B2 * | 4/2005 | Yamazaki | G02F 1/136213 257/296 |
| 6,891,195 B2 | 5/2005 | Yamazaki et al. | |
| 6,897,477 B2 * | 5/2005 | Shibata | G02F 1/136209 257/49 |
| 6,906,347 B2 * | 6/2005 | Yamazaki | H01L 27/1237 257/59 |
| 6,933,002 B2 | 8/2005 | Tera et al. | |
| 7,098,086 B2 | 8/2006 | Shibata et al. | |
| 7,122,835 B1 * | 10/2006 | Ikeda | G02F 1/13454 257/59 |
| 7,192,849 B2 | 3/2007 | Fareed et al. | |
| 7,212,255 B2 * | 5/2007 | Chung | G02F 1/136213 257/59 |
| 7,214,986 B2 * | 5/2007 | Shibata | G02F 1/136209 257/343 |
| 7,365,386 B2 * | 4/2008 | Arao | G02F 1/13454 257/303 |
| 7,402,467 B1 | 7/2008 | Kadono et al. | |
| 7,473,968 B2 * | 1/2009 | Yamazaki | H01L 27/1237 257/298 |
| 7,501,685 B2 * | 3/2009 | Shibata | G02F 1/13454 257/350 |
| 7,541,618 B2 * | 6/2009 | Shibata | G02F 1/136213 257/350 |
| 7,795,616 B2 * | 9/2010 | Yamazaki | G02F 1/13458 257/57 |
| 7,807,516 B2 * | 10/2010 | Ohnuma | H01L 27/1214 257/E21.411 |
| 7,952,093 B2 | 5/2011 | Yamazaki et al. | |
| 8,252,637 B2 | 8/2012 | Yamazaki et al. | |
| 8,492,768 B2 | 7/2013 | Yamazaki et al. | |
| 8,816,347 B2 | 8/2014 | Yamazaki et al. | |
| 2001/0029070 A1 * | 10/2001 | Yamazaki | H01L 27/1237 438/149 |
| 2002/0053699 A1 | 5/2002 | Kim et al. | |
| 2002/0071072 A1 * | 6/2002 | Ohtani | G02F 1/136213 349/110 |
| 2002/0151124 A1 | 10/2002 | Kim et al. | |
| 2002/0158272 A1 | 10/2002 | Natsume | |
| 2002/0163016 A1 * | 11/2002 | Shibata | G02F 1/136209 257/200 |
| 2003/0059986 A1 * | 3/2003 | Shibata | G02F 1/136209 438/149 |
| 2003/0214006 A1 * | 11/2003 | Nakamura | G02F 1/136286 257/448 |
| 2003/0228723 A1 * | 12/2003 | Yamazaki | H01L 21/2026 438/164 |
| 2003/0230750 A1 * | 12/2003 | Koyama | H01L 29/78696 257/72 |
| 2004/0065882 A1 * | 4/2004 | Yamazaki | G02F 1/136213 257/59 |
| 2004/0124478 A1 | 7/2004 | Nishibe et al. | |
| 2004/0224484 A1 | 11/2004 | Fareed et al. | |
| 2005/0116227 A1 * | 6/2005 | Nakamura | G02F 1/136286 257/66 |
| 2005/0161740 A1 | 7/2005 | Park et al. | |
| 2005/0167674 A1 | 8/2005 | Shibata et al. | |
| 2005/0219436 A1 | 10/2005 | Kwon et al. | |
| 2005/0247940 A1 * | 11/2005 | Shibata | G02F 1/136209 257/66 |
| 2005/0253148 A1 * | 11/2005 | Yamazaki | H01L 27/1237 257/72 |
| 2005/0253149 A1 * | 11/2005 | Yamazaki | G02F 1/136213 257/72 |
| 2006/0051927 A1 | 3/2006 | Takami | |
| 2006/0267202 A1 | 11/2006 | Matsuzaki | |
| 2006/0270191 A1 | 11/2006 | Tamura et al. | |
| 2007/0001225 A1 * | 1/2007 | Ohnuma | H01L 27/1214 257/347 |
| 2007/0141258 A1 | 6/2007 | Fareed et al. | |
| 2007/0190810 A1 * | 8/2007 | Yamazaki | H01L 21/2026 438/795 |
| 2007/0194362 A1 * | 8/2007 | Yamazaki | G02F 1/136213 257/296 |
| 2007/0200139 A1 * | 8/2007 | Shibata | G02F 1/136209 257/146 |
| 2007/0210379 A1 * | 9/2007 | Godo | H01L 29/66757 257/344 |
| 2008/0036935 A1 * | 2/2008 | Shibata | G02F 1/136213 349/38 |
| 2008/0305569 A1 | 12/2008 | Kadono et al. | |
| 2009/0057670 A1 * | 3/2009 | Yamazaki | G02F 1/136213 257/59 |
| 2009/0189173 A1 * | 7/2009 | Shibata | G02F 1/13454 257/98 |
| 2011/0012113 A1 * | 1/2011 | Ohnuma | H01L 27/1214 257/57 |

(56) References Cited

U.S. PATENT DOCUMENTS

2012/0286280 A1* 11/2012 Ohtani .............. G02F 1/136209
                                                              257/71
2014/0361370 A1   12/2014 Yamazaki et al.

FOREIGN PATENT DOCUMENTS

| | | | |
|---|---|---|---|
| EP | 1564713 | A | 8/2005 |
| JP | 04-344618 | A | 12/1992 |
| JP | 06-265940 | A | 9/1994 |
| JP | 07-022627 | A | 1/1995 |
| JP | 07-263705 | A | 10/1995 |
| JP | 08-078329 | A | 3/1996 |
| JP | 11-204435 | A | 7/1999 |
| JP | 2924506 | | 7/1999 |
| JP | 2000-353810 | A | 12/2000 |
| JP | 2001-007045 | A | 1/2001 |
| JP | 2001-066638 | A | 3/2001 |
| JP | 2001-144301 | A | 5/2001 |
| JP | 2001-144302 | A | 5/2001 |
| JP | 2002-182244 | A | 6/2002 |
| JP | 2002-185010 | A | 6/2002 |

* cited by examiner

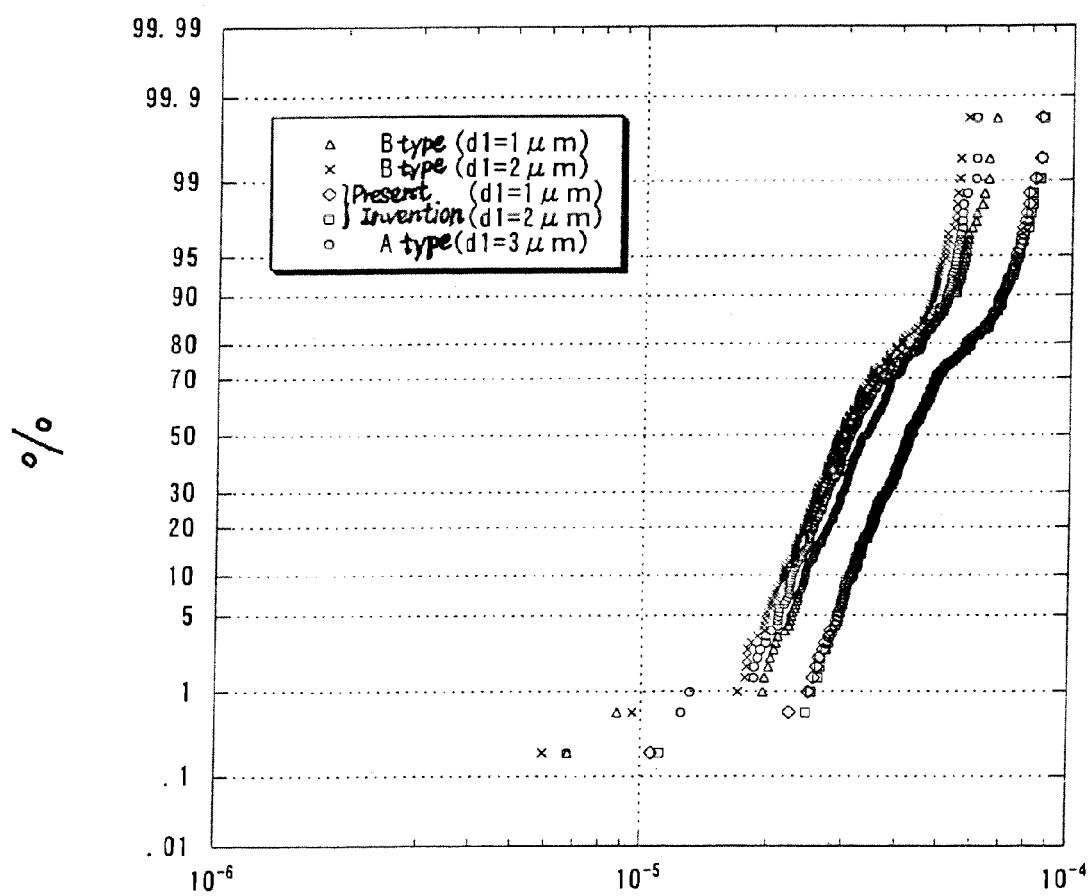

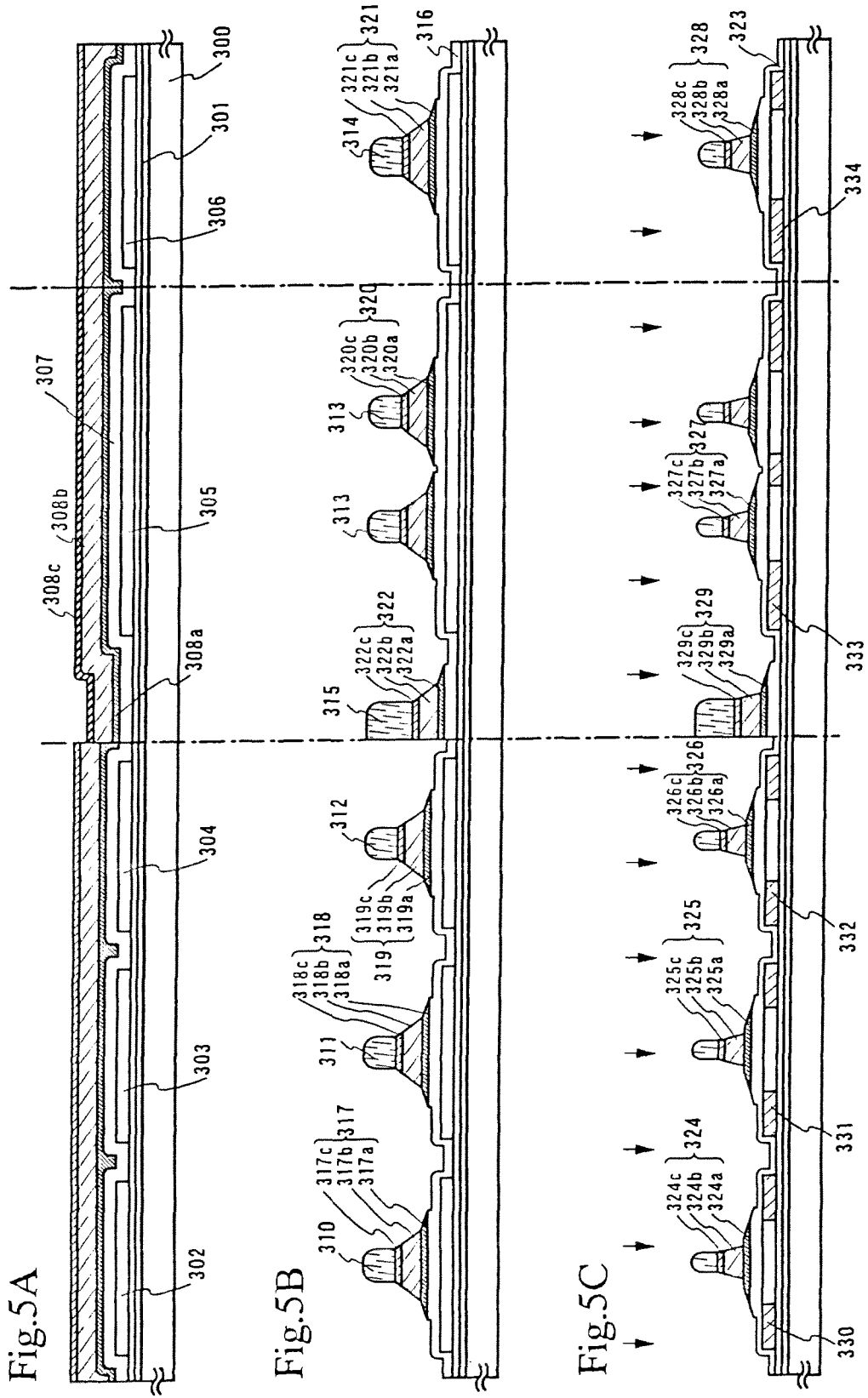

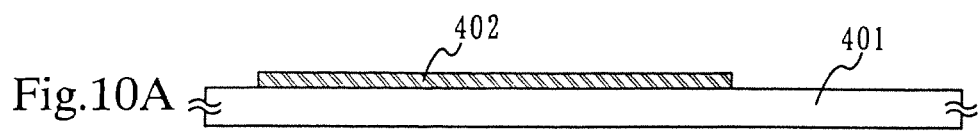
Fig.10A
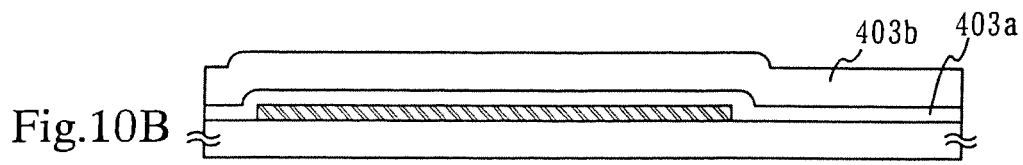
Fig.10B
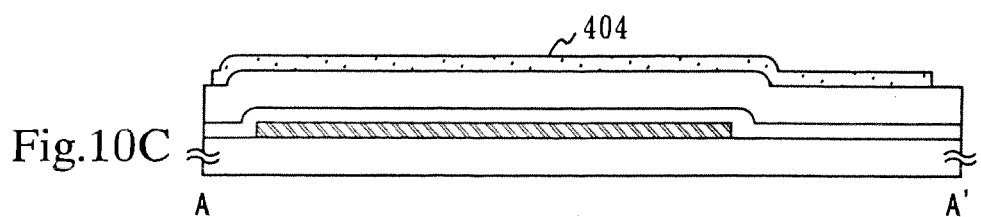
Fig.10C
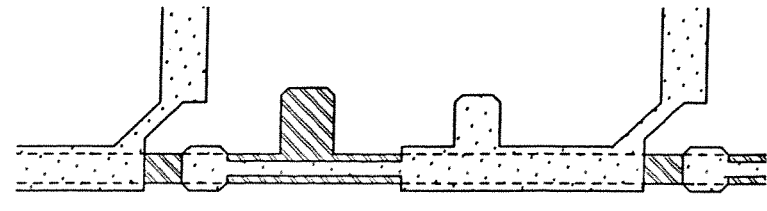
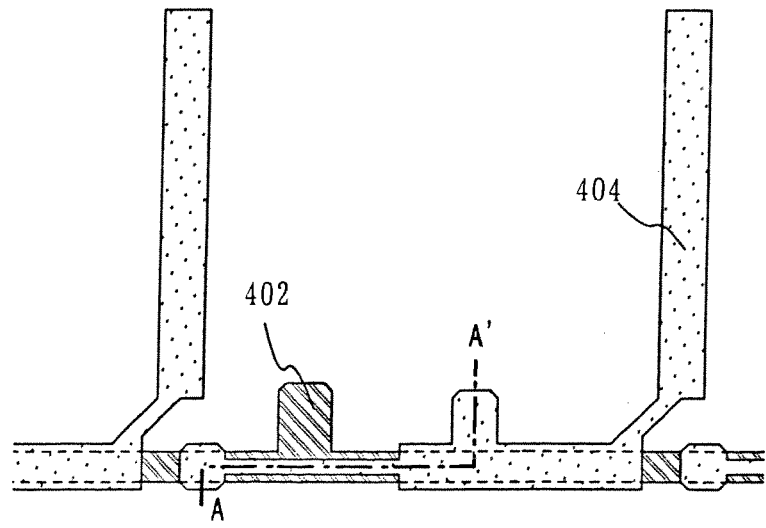
Fig.10D

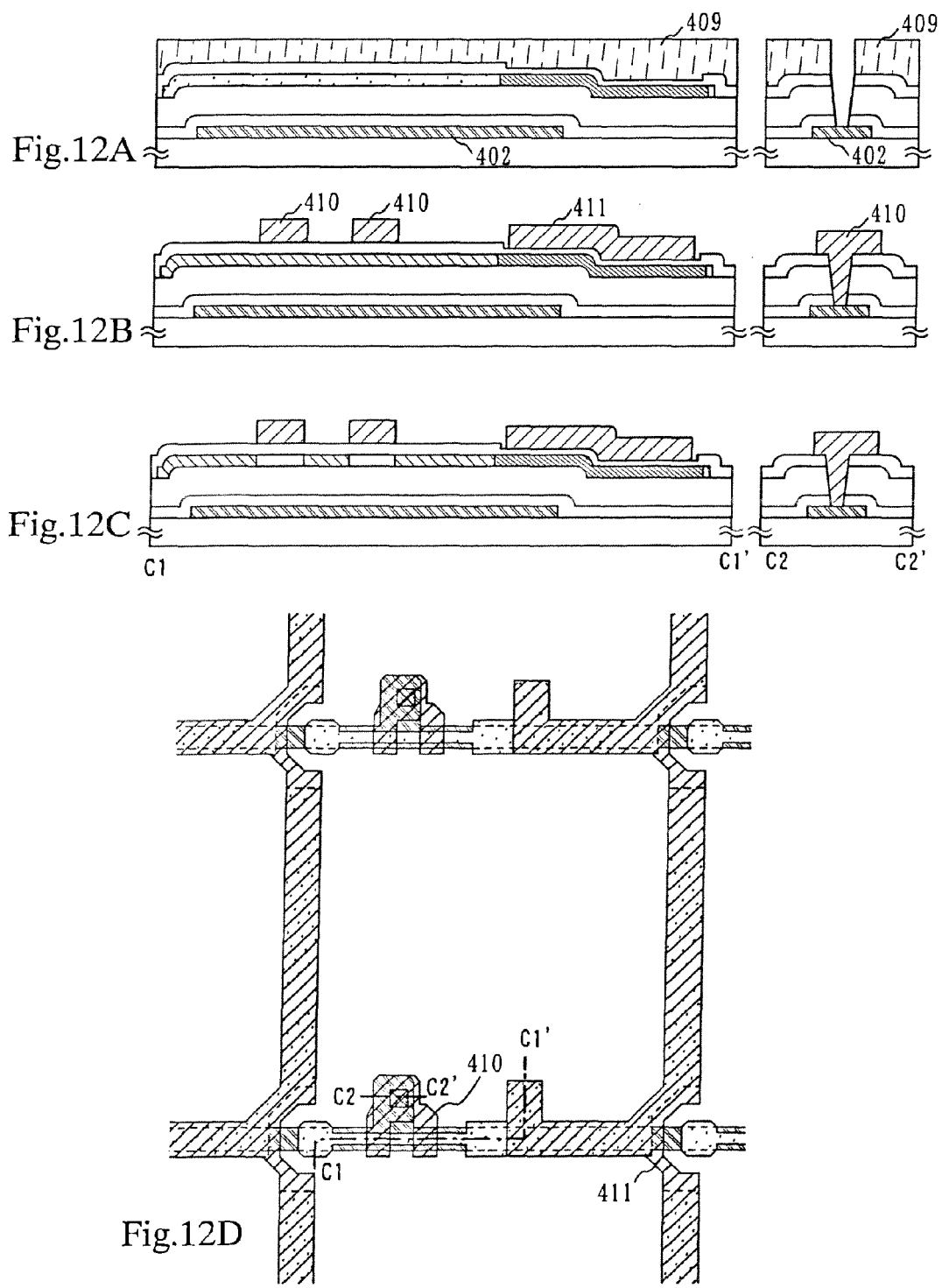

$d1>d2$

SEMICONDUCTOR DEVICE, MANUFACTURING METHOD THEREOF, AND DISPLAY DEVICE

BACKGROUND OF THE INVENTION

1. Field of the Invention

The present invention relates to a semiconductor device which has a circuit composed of a thin film transistor (hereinafter referred to as a TFT) and a manufacturing method thereof. The present invention relates to, for example, an electro-optical device represented by a liquid crystal display panel and electronic equipment in which such an electro-optical device is mounted as a part.

Note that in this specification, a semiconductor device indicates a general device which functions by utilizing semiconductor characteristics, and an electro-optical device, a semiconductor circuit, and an electronic device are each a semiconductor device.

2. Description of the Related Art

In recent years, the development of a semiconductor device, which has a large area integrated circuit manufactured from a thin film transistor (TFT) using a semiconductor thin film (about several nm to several hundred nm in thickness) formed on a substrate with an insulating surface, has been progressed. An active matrix liquid crystal display device, an EL display device, and a contact type image sensor have been known as typical examples thereof. In particular, since a TFT using a crystalline silicon film (typically, a polysilicon film) as an active layer (hereinafter referred to as a polysilicon TFT) has high field effect mobility, it is also possible to form various functional circuits.

For example, in the case of the active matrix liquid crystal display device, a pixel circuit for displaying an image in each functional block and a driver circuit for controlling the pixel circuit, which is composed of a shift register circuit, a level shifter circuit, a buffer circuit, a sampling circuit, and the like using CMOS circuits as fundamental circuits, are formed on a single substrate.

In the case of the pixel circuit of the active matrix liquid crystal display device, TFTs (pixel TFTs) are arranged in several tens to several millions of pixels and a pixel electrode is provided in each of the pixel TFTs. An opposing electrode is provided at an opposing substrate side sandwiching liquid crystal, and a kind of capacitor using the liquid crystal as a dielectric is formed. Thus, voltage applied to each of the pixels is controlled by a switching function of the TFT to control a charge to the capacitor and drive the liquid crystal, the amount of transmitting light is controlled to display an image.

The use of such an active matrix liquid crystal display device has been diversified and the demand for high definition, high aperture ratio, and high reliability has been increased as a screen size becomes larger in area. Also, simultaneously, the demand for an improvement of productivity and a reduction in a cost has been increased.

An advantage of the active matrix display device is that an integrated circuit such as a shift register, a latch, or a buffer, which is composed of TFTs, can be formed as a driver circuit for transmitting signals to a pixel portion on the same substrate. Thus, the number of contact points with external circuits can be extremely reduced to improve the reliability of the display device.

Also, the pixel TFT is an n-channel TFT and used as a switching element for applying voltage to liquid crystal for driving. Since the liquid crystal is driven by an alternating current, a method called frame inverting drive is employed in many cases. In this method, in order to decrease the power consumption, it is important to sufficiently reduce an off current value (drain current flowing in placing the TFT in an off operation state) as a characteristic required for the pixel TFT. In addition, a characteristic such as a sufficient small parasitic capacitance between a gate and a drain is required. Since a pixel capacitance is small to cause an insufficient retaining operation, an auxiliary capacitor is provided in a pixel to implement such an operation and to prevent the influence of the parasitic capacitor.

A low concentration drain (LDD: lightly doped drain) structure has been known as a structure of a TFT for reducing an off current value. According to this structure, a region to which an impurity element is added at a low concentration is provided between a channel forming region and a source region or a drain region which is formed by adding an impurity element at a high concentration, and this region is called a LDD region.

Also, a multi-gate structure such as a double gate structure or a triple gate structure, which has a plurality of channel forming regions, has been known as a structure of a TFT for reducing a variation in an off current value. As shown in FIGS. 27A and 27B, when two TFTs are simply connected with each other to obtain a double gate structure, a total size of the TFTs for one pixel becomes large and this causes a reduction in an aperture ratio.

In a pixel for an active matrix driving system, a pixel electrode for applying voltage to liquid crystal is provided and a scan line (gate line) connected with a gate electrode and a data line connected with a source or a drain are intersected. Two types, an additional capacitor type in which the pixel electrode and the fore stage scan line (gate line) are overlapped with each other and a storage capacitor type in which a dedicated capacitor line is provided, have been known as auxiliary capacitors. In either of the two types, the allowable sizes of a TFT and an auxiliary capacitor for one pixel are necessarily reduced with an improved definition of an image. Thus, in order to obtain a high aperture ratio for respective pixels in a specific pixel size, it is essential that elements required for a structure of the pixels is efficiently laid out.

Also, with respect to the liquid crystal display device, two types, a direct view type for directly viewing an image displayed in a pixel portion and a projection type for displaying an image on a screen using an optical system, are being developed. Both types are selectively used based on a screen size, and the direct view type is used for a size up to about 30 inches and the projection type is used for the size or larger.

Also, in the case of all liquid crystal display devices, particularly, a liquid crystal display device for a projector, a variation in a characteristic of a TFT located in each pixel is caused by a photo leak current produced by incidence light into a semiconductor layer through various paths. Thus, a deterioration of an image quality (reduction in a contrast, a flicker, a cross talk, or the like) becomes a problem.

SUMMARY OF THE INVENTION

There is a problem that compatibility of an increase in an aperture ratio and a reduction in a photo leak current or compatibility of an increase in the aperture ratio and a reduction in an off current value is difficult in the above-mentioned conventional pixel structure or TFT structure.

Such a requirement becomes a large problem in the case where a pitch of respective display pixels is reduced with an increased definition (increasing the number of pixels) of the liquid crystal display device and the miniaturized liquid crystal display device.

Also, since a TFT with a multi-gate structure has a small on current value, which becomes a failure in the case where high speed drive is performed in the liquid crystal display device.

An object of the present invention is to provide a TFT structure which is resistant to a deterioration of image quality by incidence light into a semiconductor layer and which occupies a reduced area in one pixel together, in addition to providing a TFT structure with a small off current value and a large on current value.

Also, in the case of a transmission type active matrix liquid crystal display device, a light shielding layer is a necessary element. The semiconductor layer has a photoconductive effect in which a resistance value is changed by light irradiation, and an off current is increased by irradiating light from a light source thereto. In particular, in the case of a projection type display device, it becomes a problem that a portion of light transmitting the liquid crystal display device is reflected from the boundary between a substrate and an air layer or reflected from an optical system and then returned in an opposite direction into a TFT.

In the case of the projection type using a metal halide lamp or the like as a light source, a design of the light shielding layer is important since 100 millions lux to 2000 millions lux of light is irradiated to the liquid crystal display device. On the other hand, it is required that incidence light into the TFT is suppressed to about 100 lux to reduce an off current. Generally, although the light shielding layer is formed in the upper layer portion or the lower layer portion of the semiconductor layer in the TFT, about 0.1% to 1% of incidence light (light from a light source) is incident thereinto as diffraction light.

With respect to the semiconductor layer, conductivity is increased by the photoconductive effect to increase an off current of the TFT. Thus, image display is affected by a reduction in a contrast, an occurrence of a cross talk, or the like. However, when light shielding property has priority to increase an area of the light shielding layer in order to block such light, an aperture ratio is naturally reduced.

In order to realize a high aperture ratio in a specific pixel size, it is essential that elements required for a structure of a pixel portion are efficiently laid out. An object of the present invention is to provide an active matrix display device which has a pixel structure in which a high aperture ratio is realized by suitably arranging a pixel electrode, a scan line (gate line), and a data line, which are formed in a pixel portion.

Also, as means for forming a crystalline silicon film on an insulating surface, a method of crystallizing an amorphous silicon film by laser annealing or thermal treatment using an electric heat furnace is used in addition to a method of directly forming a crystalline silicon film by a low pressure CVD method. Even when either of these methods is applied, a field effect mobility value of only about 100 $cm^2$/Vsec to 200 $cm^2$/Vsec can be obtained in an n-channel TFT and a field effect mobility value of only about 50 $cm^2$/Vsec to 100 $cm^2$/Vsec can be obtained in a p-channel TFT. In addition, since a threshold voltage is 3 V in the n-channel TFT and a subthreshold coefficient (S value) is 300 mV/dec, a drive voltage becomes 14 V. Thus, reductions in a power source voltage and power consumption are challenges.

In order to realize a low voltage and low power consumption, it is necessary to increase a size of crystal grain in the crystalline silicon film, improve the mobility, and reduce the S value. In addition, it is required that a variation in the threshold voltage is suppressed.

With respect to a technique for increasing the size of crystal grains and an application thereof to the TFT, there is a report example in "Ultra-high Performance Poly-Si TFTs on a Glass by a Stable Scanning CW Laser Lateral Crystallization", A. Hara, F. Takeuchi, M. Takei, K. Yoshino, K. Suga and N. Sasaki, AMLCD, '01, Tech. Dig., 2001, pp. 227-230. According to the report example, it is described that a TFT is prototyped from a polycrystalline silicon film crystallized using the second harmonic of a solid continuous oscillating laser ($YVO_4$) by diode excitation and the improvement of field effect mobility is reported as a result.

However, even when a large size in the crystalline silicon film can be realized, in the case of a structure in which the light shielding film and the semiconductor film are overlapped with each other, the light shielding film is altered in irradiation of continuous oscillating laser light and laser light reflected from the light shielding film formed in the lower layer side of the semiconductor film is diffused to inhibit uniform crystallization. Thus, it becomes a problem that a distortion is accumulated and a threshold voltage is varied.

Also, when an internal stress from the light shielding film and an insulating film, which are formed in the lower layer side of the semiconductor film, is changed in the irradiation of continuous oscillating laser light, a problem in that the threshold voltage is varied is caused.

In addition, the present invention has been made in view of the above problems and an object thereof is also to reduce driving voltages of various integrated circuits composed of TFTs to realize low power consumption.

According to the present invention, a multi-gate structure such as a double gate structure or a triple gate structure which has a plurality of channel forming regions is used for a pixel TFT and an interval between adjacent gate electrodes in one pixel TFT is made to be shorter than a width of a low concentration impurity region (LDD region). In one pixel TFT with a multi-gate structure, the low concentration impurity region is provided between a source region and a channel forming region which is located in the nearest position to the source region, and between a drain region and a channel forming region which is located in the nearest position to the drain region, in two locations in total. Note that, since a pixel using liquid crystal is generally driven by an alternating current, the source region and the drain region in the pixel TFT are alternately changed. Thus, a width of a low concentration impurity region provided between one channel forming region and the source region is equal to that of a low concentration impurity region provided between the other channel forming region and the drain region.

Also, only a high concentration impurity region containing an impurity element at a concentration which is approximately the same as or higher than the source region or the drain region, is formed as a region sandwiched by two adjacent channel forming region in one TFT. Thus, while the resistance of the entire semiconductor layer of a TFT which is in an on state is reduced, light sensitivity is reduced in the case of incidence light into the TFT for some reason.

In other word, according to the present invention, a width of the high concentration impurity region sandwiched by two adjacent channel forming regions in a channel length direction is made to be shorter than that of the low concentration impurity region in the channel length direction. Thus, an occupying area of a TFT in one pixel is reduced to improve an aperture ratio of the pixel. In addition, according to the present invention, the plurality of channel forming regions are provided. Thus, even if a failure such as a current leakage is caused in one channel forming region, the other channel forming region normally functions to reduce an abnormal value of an off current to suppress the variation. Further, even if light shielding property to the pixel TFT is deteriorated for some reason and light is incident into the TFT, the light sensitivity in an off current value is reduced to suppress a display failure.

According to a structure (1) disclosed in this specification, there is provided a semiconductor device including a TFT that has a semiconductor layer formed on an insulating surface, an insulating film formed on the semiconductor layer, and a plurality of gate electrodes formed on the insulating film, characterized in that the semiconductor layer has: a plurality of channel forming regions overlapped with the gate electrodes through the insulating film interposed therebetween; a source region; a drain region; and a low concentration impurity region located between one of the channel forming regions and one of the source region and the drain region, and that an interval between two adjacent gate electrodes of the plurality of gate electrodes is shorter than a width of the low concentration impurity region.

Also, according to another structure (2) of the present invention, there is provided a semiconductor device including a TFT that has a semiconductor layer formed on an insulating surface, an insulating film formed on the semiconductor layer, and a plurality of gate electrodes formed on the insulating film, characterized in that the semiconductor layer has: a plurality of channel forming regions overlapped with the gate electrodes through the insulating film interposed therebetween; a source region; a drain region; a high concentration impurity region located adjacent to two of the plurality of channel forming regions; and a low concentration impurity region located between one of the channel forming regions and one of the source region and the drain region, and that an interval between two adjacent gate electrodes of the plurality of gate electrodes is shorter than a width of the low concentration impurity region.

With respect to the above structure (2), when the high concentration impurity region and the source region or the drain region are formed in the same step, the high concentration impurity region have the same impurity concentration as the source region or the drain region.

Also, with respect to the above structure (2), when the high concentration impurity region is formed in a separate step from the source region or the drain region, the high concentration impurity region can have a higher impurity concentration than the source region or the drain region. Thus, when the concentration of the high concentration impurity region is higher than that of another region, the resistance of the entire semiconductor layer of a TFT which is in an on state is reduced to increase an on current. In addition, a carrier life time due to photoexcitation produced in the high concentration impurity region can be shortened to reduce light sensitivity.

Also, with respect to the above structure (2), when the high concentration impurity region is formed in a separate step from the source region or the drain region, the high concentration impurity region have an impurity concentration which is higher than the low concentration impurity region and lower than the source region or the drain region.

Also, with respect to the above structure (2), the width of the high concentration impurity region is equal to an interval between adjacent gate electrodes.

Also, with respect to the above structure (1) or the above structure (2), an interval between two adjacent channel forming regions of the plurality of channel forming regions is equal to that between two adjacent gate electrodes.

Also, when the present invention is applied to the TFT with the double gate structure, the following TFT structure is used. That is, a low concentration impurity region (LDD region) is provided between one channel forming region and the drain region, a low concentration impurity region (LDD region) is provided between the other channel forming region and the source region, and a high concentration impurity region is provided between the two channel forming regions. Thus, the width of the high concentration impurity region in the channel length direction is made to be shorter than that of the low concentration impurity region in the channel length region.

Also, according to another structure (3) of the present invention, there is provided a semiconductor device including a TFT that has a semiconductor layer formed on an insulating surface, an insulating film formed on the semiconductor layer, and a first gate electrode and a second gate electrode which are formed on the insulating film, characterized in that the semiconductor layer has: a first channel forming region overlapped with the first gate electrode through the insulating film interposed therebetween, a second channel forming region overlapped with the second gate electrode through the insulating film interposed therebetween; a high concentration impurity region located adjacent to both the first channel forming region and the second channel forming region; a first low concentration impurity region located in contact with the first channel forming region; a drain region located in contact with the first low concentration impurity region; a second low concentration impurity region located in contact with the second channel forming region; and a source region located in contact with the second low concentration impurity region, and that an interval between the first gate electrode and the second gate electrode is shorter than a width of the first low concentration impurity region.

With respect to the above structure (3), when the high concentration impurity region and the source region or the drain region are formed in the same step, the high concentration impurity region can have at the same impurity concentration as the source region or the drain region.

Also, with respect to the above structure (3), when the high concentration impurity region is formed in a separate step from the source region or the drain region, the high concentration impurity region can have a higher impurity concentration than the source region or the drain region. Thus, when the concentration of the high concentration impurity region is higher than that of another region, the resistance of the entire semiconductor layer of a TFT which is in an on state is reduced to increase an on current. In addition, a carrier life time due to photoexcitation produced in the high concentration impurity region can be shortened to reduce light sensitivity.

Also, with respect to the above structure (3), when the high concentration impurity region is formed in a separate step from the source region or the drain region, the high concentration impurity region can have an impurity concentration which is higher than the low concentration impurity region and lower than the source region or the drain region.

Also, with respect to the above structure (3), the width of the high concentration impurity region is equal to or shorter than that of the first low concentration impurity region.

Also, with respect to the above structure (3), the width of the high concentration impurity region is equal to or shorter than that of the second low concentration impurity region.

Also, according to the present invention, a TFT structure in which the high concentration impurity region is provided between the two channel forming regions is used. Thus, the width of the high concentration impurity region in the channel length direction may be equal to that of the low concentration impurity region in the channel length region.

Also, according to another structure (4) or the present invention, there is provided a semiconductor device including a TFT that has a semiconductor layer formed on an insulating surface, an insulating film formed on the semiconductor layer, and a plurality of gate electrodes formed on the insulating film, characterized in that the semiconductor layer has: a plurality of channel forming regions overlapped with the gate electrodes through the insulating film interposed therebetween; a source region; a drain region; a high concentration impurity region located adjacent to two of the plurality of channel forming regions; and a low concentration impurity region located between one of the channel forming regions and one of the source region and the drain region, and that an interval between two adjacent gate electrodes of the plurality of gate electrodes is equal to a width of the low concentration impurity region.

With respect to the above structure (4), when the high concentration impurity region and the source region or the drain region are formed in the same step, the high concentration impurity region can have the same impurity concentration as the source region or the drain region.

Also, with respect to the above structure (4), when the high concentration impurity region is formed in a separate step from the source region or drain region, the high concentration impurity region can have a higher impurity concentration than the source region or the drain region. Thus, when the concentration of the high concentration impurity region is higher than that of another region, the resistance of the entire semiconductor layer of a TFT which is in an on state is reduced to increase an on current. In addition, a carrier life time due to photoexcitation produced in the high concentration impurity region can be shortened to reduce light sensitivity.

Also, with respect to the above structure (4), when the high concentration impurity region is formed in a separate step from the source region or the drain region, the high concentration impurity region can have an impurity concentration which is higher than the low concentration impurity region and lower than the source region or the drain region.

Also, with respect to the above structures (1) to (4), the TFT is an n-channel TFT or a p-channel TFT.

Also, with respect to the above structures (1) to (4), a semiconductor device is typically a liquid crystal display device or a light emitting device having an EL element, which has a pixel electrode electrically connected to the source region or the drain region.

Also, with respect to a display device of the present invention, in a semiconductor device (typically, a liquid crystal display device) in which a pixel electrode, a thin film transistor, and a capacitor element are provided on a substrate, one electrode of the capacitor element is connected with one of a source and a drain of the thin film transistor, and the electrode is extended over a gate electrode of the thin film transistor.

Also, according to another structure, there is provided a semiconductor device in which a pixel electrode, a thin film transistor, and a capacitor element are provided on a substrate, one electrode of the capacitor element is connected with one of a source and a drain of the thin film transistor, and the electrode is extended over a gate electrode of the thin film transistor as a light shielding layer and overlapped with another light shielding layer provided in the upper layer of the gate electrode.

Also, according to another structure, there is provided a semiconductor device in which a pixel electrode, a thin film transistor, and a capacitor element are provided on a substrate, one electrode of the capacitor element, which is formed on an insulating layer, is connected with one of a source and a drain of the thin film transistor, the insulating layer covers a gate electrode of the thin film transistor, and the electrode is extended over the gate electrode of the thin film transistor and overlapped with another light shielding layer provided in the upper layer of the gate electrode.

Also, according to another structure, there is provided a semiconductor device including: a substrate; a semiconductor layer formed over the substrate; a first light shielding layer formed between the substrate and the semiconductor layer; a gate electrode formed over the semiconductor layer; a pixel electrode formed in an upper layer of the gate electrode; a third light shielding layer formed between the gate electrode and the pixel electrode; and a second light shielding layer formed between the gate electrode and the third light shielding layer, wherein the gate electrode is overlapped with the first, the second, and the third light shielding layers.

Also, according to another structure, there is provided a semiconductor device in which a pixel electrode, a thin film transistor, and a capacitor element are provided on a substrate, the semiconductor device comprising: a first light shielding layer formed over the substrate; a first insulating layer formed on the first light shielding layer; a semiconductor layer formed on the first insulating layer; a second insulating layer formed on the semiconductor layer; a gate electrode and a capacitor wiring which are formed on the second insulating layer; a third insulating layer formed on the gate electrode and the capacitor wiring; a second light shielding layer formed on the third insulating layer; a fourth insulating layer formed on the second light shielding layer; source and drain wirings formed on the fourth insulating layer; a fifth insulating layer formed on the source and drain wiring; a third light shielding layer formed on the fifth insulating layer; a sixth insulating layer formed on the third light shielding layer; and a pixel electrode formed on the sixth insulating layer, wherein the capacitor element is formed by the semiconductor layer, the second insulating layer, the capacitor wiring, the third insulating layer, and the second light shielding layer, and the second light shielding layer is extended over the gate electrode.

According to the above structure, when the light shielding layer is extended over the gate electrode, incidence of diffraction light into the semiconductor layer and an increase in an off current of the TFT by the diffraction light can be prevented. In addition, when elements required for the structure of the pixel portion are efficiently arranged, a high aperture ratio can be realized in a specific pixel size.

Also, in order to reduce drive voltages of various integrated circuits composed of TFTs to realize low power consumption, a structure of the present invention is characterized by including a second crystalline semiconductor film formed in contact with a first crystalline semiconductor film over an insulating substrate, a first light shielding film formed between the insulating substrate and the first crystalline semiconductor film, a gate electrode formed over the second crystalline semiconductor film, a pixel electrode formed over the gate electrode, a third light shielding layer formed between the gate electrode and the pixel electrode, and a second light shielding layer formed between the gate electrode and the third light shielding layer, in which an average crystal grain size in the second crystalline semiconductor film is larger than that in the first crystalline semiconductor film.

Also, according to the present invention, there is provided a method of manufacturing a semiconductor device including the steps of: forming a first conductive layer which has a light shielding property on an insulating surface; forming a first insulating layer covering the first conductive layer; forming a first amorphous semiconductor film on the first insulating layer; crystallizing the first amorphous semiconductor film by thermal treatment without melting to form a first crystalline semiconductor film; forming a second amorphous semiconductor film on the first crystalline semiconductor film; and crystallizing the second amorphous semiconductor film after melting a portion or a whole thereof by irradiation of laser light.

In the above structure of the present invention, a solid laser oscillating device or a gas laser oscillating device is applied as a light source for laser light. One kind of device with continuous oscillation or pulse oscillation selected from the group consisting of a YAG laser oscillating device, a $YVO_4$ laser oscillating device, a YLF laser oscillating device, a $YAlO_3$ laser oscillating device, a glass laser oscillating device, a ruby laser oscillating device, an alexandrite laser oscillating device, and a Ti: sapphire laser oscillating device is applied as the solid laser oscillating device. It is desirable that laser light is converted into the second harmonic or the third harmonic by a non-linear optical element. One kind of device with continuous oscillation or pulse oscillation selected from the group consisting of an excimer laser oscillating device, an Ar laser oscillating device, a Kr laser oscillating device, and a $CO_2$ laser oscillating device is applied as the gas laser. In addition, a helium cadmium laser oscillating device, a copper vapor laser oscillating device, and a gold vapor laser oscillating device may be applied as a metallic laser oscillating device.

After the first crystalline semiconductor film is formed, the second amorphous semiconductor film is formed and crystallized by irradiation of laser light. Thus, the first crystalline semiconductor film functions to relax an internal stress at laser irradiation from a different kind of film, the base insulating film and the light shielding film. In addition, the first crystalline semiconductor film prevents the alternation of the light shielding film due to the irradiation of laser light, and diffuse reflection of the laser light reflected from the light shielding film formed under the first crystalline semiconductor film. Therefore, the accumulation of a distortion is relaxed and a variation in a threshold voltage of a TFT can be prevented.

BRIEF DESCRIPTION OF THE DRAWINGS

In the accompanying drawings:

FIG. 3 is a graph indicating a probability distribution of an on current value;

FIGS. 5A to 5C show steps of manufacturing an active matrix substrate;

FIGS. 10A to 10D show steps of manufacturing an active matrix substrate;

FIGS. 12A to 12D show steps of manufacturing the active matrix substrate;

DETAILED DESCRIPTION OF THE PREFERRED EMBODIMENTS

Embodiment Mode 1

Figure 1A:
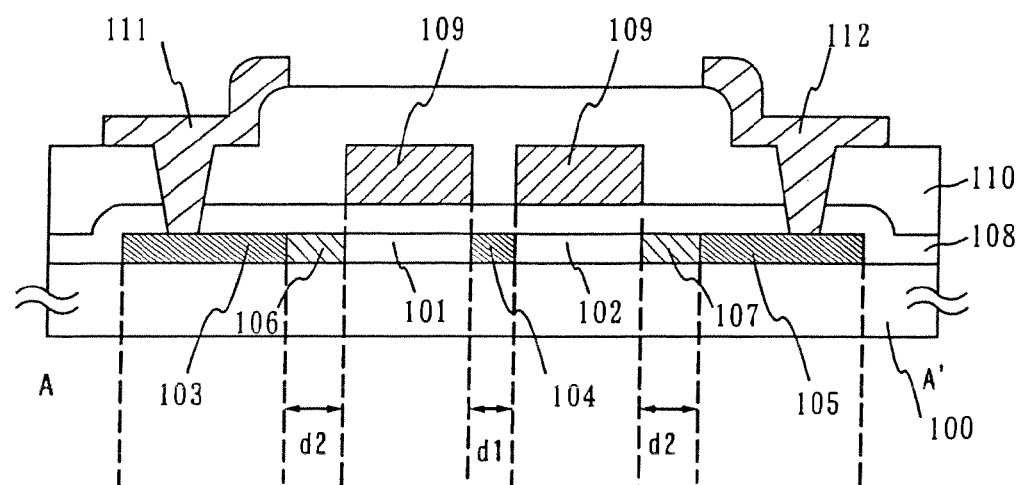
FIGS. 1A and 1B are a cross sectional view and a top view according to the present invention (Embodiment Mode 1)
Figure 1B:
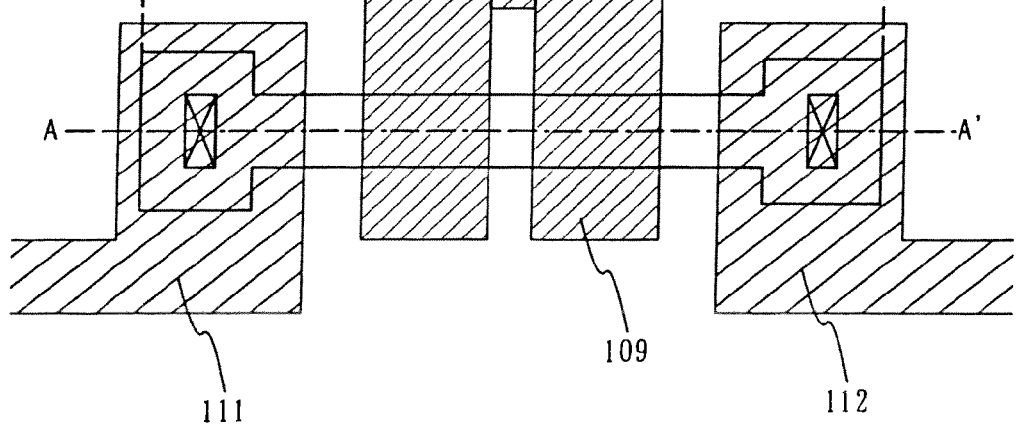

One example in the case of applying the present invention to a TFT with a double gate structure is shown in FIGS. 1A and 1B and described below.

In FIGS. 1A and 1B, reference numeral 100 denotes a substrate, 101 and 102 denote channel forming regions, 103 and 105 denote a source region and a drain region, 104 denotes a high concentration impurity region, 106 and 107 denote low concentration impurity regions (LDD regions), 108 denotes a gate insulating film, 109 denotes gate electrodes, 110 denotes an interlayer insulating film, and 111 and 112 denote a source electrode and a drain electrode. Note that FIG. 1A is a cross sectional view taken along the dotted line A-A' of FIG. 1B which is a top view of a TFT.

The present invention is characterized in that only the high concentration impurity region 104 is formed as a region sandwiched by the two channel forming regions 101 and 102. An interval d1 between the adjacent gate electrodes 109, that is, a width of the high concentration impurity region in a channel length direction is designed to be shorter than a width d2 of the low concentration impurity regions 106 and 107. Thus, the interval between the two channel forming regions can be shortened and an area occupied by the TFT in one pixel can be reduced. In addition, since the region sandwiched by the two channel forming regions is the high concentration impurity region, light sensitivity in the case where light is incident into a TFT for some reason is reduced while the resistance of the entire semiconductor layer of the TFT which is in an on state is reduced.

Figure 27A:
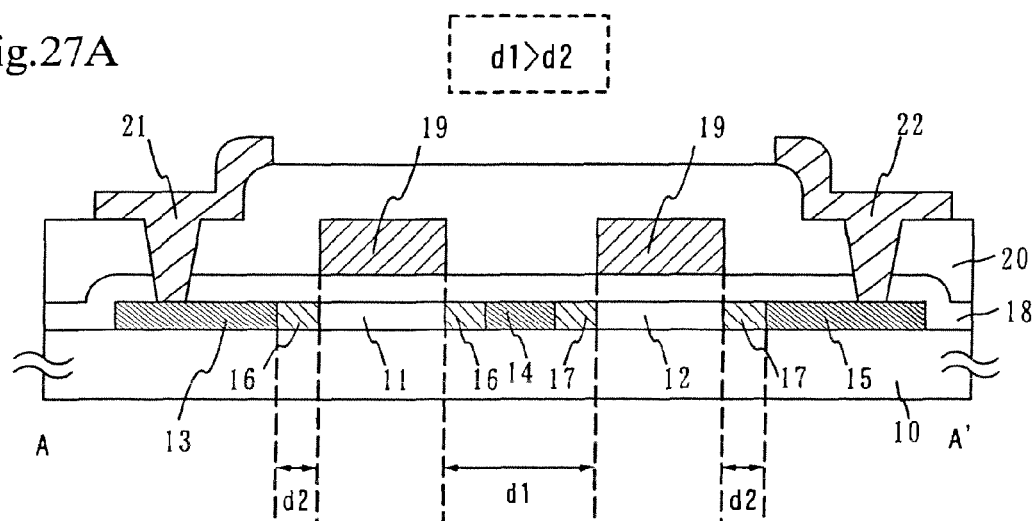
FIGS. 27A and 27B show a conventional example.
Figure 27B:
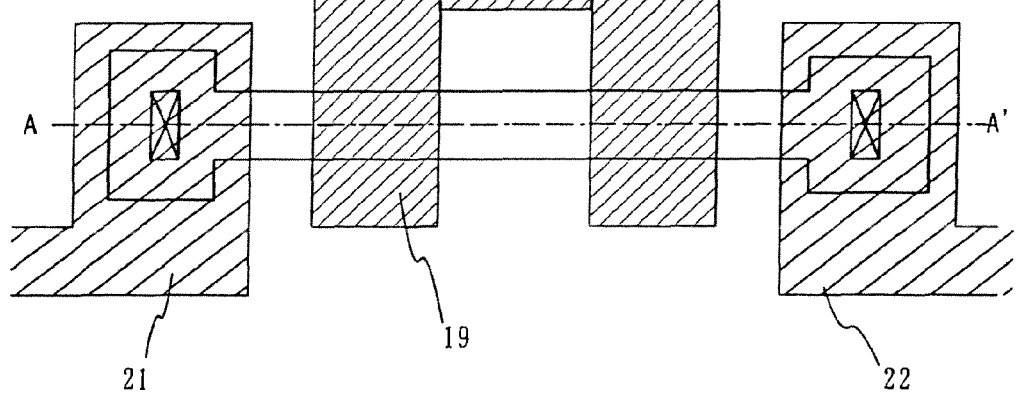

Conventionally, it is necessary to form the LDD regions sandwiching the channel forming region in both sides thereof and there is a TFT structure including a double gate structure (disclosed in JP 06-265940 A) in which two TFTs are simply connected with each other (hereinafter called an A-type) as shown in FIGS. 27A and 27B. In this structure (A-type), an area occupied by the TFT in one pixel is increased. Note that, according to this TFT structure (A-type), as shown in FIGS.

27A and 27B, both low concentration impurity regions 16 and 17 and a high concentration impurity region 14 are formed between two channel forming regions 11 and 12, which is greatly different from the present invention. In addition, according to this structure (A-type), an interval d1 between adjacent gate electrodes 19 becomes longer than a width d2 of the low concentration impurity regions 16 and 17, that is, d1>d2. According to the TFT structure of the present invention, only the high concentration impurity region is formed between the two channel forming regions and an on current value is larger than that in the TFT structure (A-type). Note that, in FIGS. 27A and 27B, reference numeral 10 denotes a substrate, 13 and 15 denote a source region and a drain region, 18 denotes a gate insulating film, 20 denotes an interlayer insulating film, and 21 and 22 denote a source electrode and a drain electrode.

Also, a TFT structure disclosed in JP 04-344618 A and JP 07-263705 A is proposed. According to the TFT structure disclosed in these documents (hereinafter called a B-type), only a low concentration impurity region is formed between two channel forming regions, which is greatly different from the present invention. According to the TFT structure of the present invention, only the high concentration impurity region is formed between the two channel forming regions and an on current value is larger than that in the TFT structure (B-type). In addition, d1>d2 in the TFT structure (B-type).

Further, the low concentration impurity region is formed between the two channel forming regions in the case of the above TFT structures (A-type and B-type). Thus, a TFT characteristic is greatly varied when light is incident into a region between the two channel forming regions, as compared with the present invention.

Also, a TFT structure disclosed in JP 07-22627 A (hereinafter called a C-type) is proposed. According to this TFT structure (C-type), although only a high concentration impurity region is formed between two channel forming regions, an offset region is formed while a low concentration impurity region is not provided therein, which is greatly different from the present invention. According to the TFT structure of the present invention, low concentration impurity regions are formed between the channel forming region and the source region and between the channel forming region and the drain region, an off current value is smaller than that in the TFT structure (C-type), and an on current value is larger than that in C-type. In addition, d1>d2 in the TFT structure (C-type).

Also, with respect to the above TFT structure (C-type), a TFT characteristic is greatly varied when light is incident into the offset region provided between the channel forming region and the source region or the drain region, as compared with the present invention in which the low concentration impurity regions are provided between the channel forming region and the source region and between the channel forming region and the drain region.

Also, according to the present invention, the interval d1 between the adjacent gate electrodes 109 is provided to be shorter than the width d2 of the low concentration impurity regions 106 and 107 and light is hard to be incident into a region between the two channel forming regions as compared with the conventional TFT structures (A-type, B-type, and C-type).

A comparison experiment conducted by the present inventors and its experimental result will be indicated below.

Figure 4:
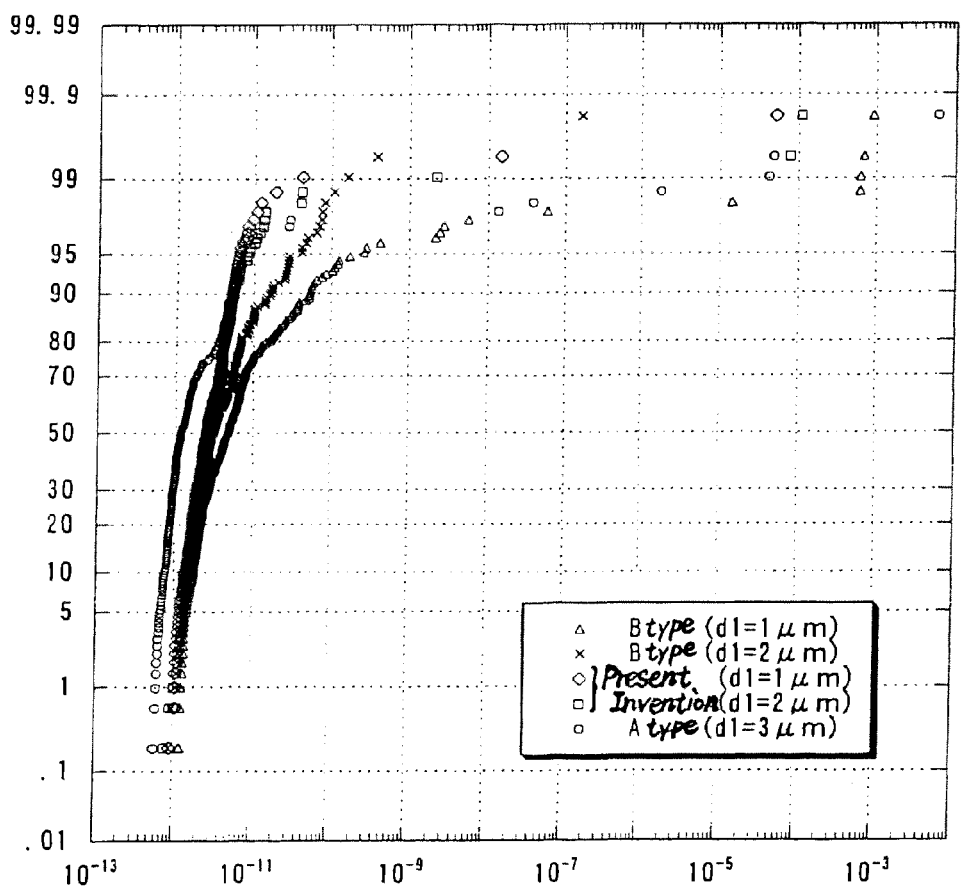
FIG. 4 is a graph indicating a probability distribution of an off current value.

First, an amorphous silicon film is formed on a substrate with an insulating surface and then crystallized to form a silicon film with a crystal structure. Then, a TFT using the silicon film as an active layer is manufactured and a pixel including the pixel TFT structure of the present invention, that is, the TFT in which only the high concentration impurity region located between the two channel forming region (23 μm×23 μm) is produced. With respect to widths of respective portions in a channel direction, the widths of the gate electrode and the channel forming region are respectively set to be 2 μm and the width d2 of the LDD regions is set to be 1.3 μm. Then, respective pixel TFTs in which the interval d1 between the adjacent gate electrodes is set to 1 μm and 2 μm are manufactured and results obtained by measuring on current values and off current values in the pixel TFTs are indicated in FIGS. 3 and 4.

Also, for comparison, a pixel including the TFT with the above A-type, that is, a pixel including the TFT in which the LDD regions and the high concentration impurity region sandwiched by the LDD regions are located between the two channel forming regions is produced. With respect to widths of respective portions in the channel direction, the widths of the gate electrode and the channel forming region are respectively set to be 2 μm and the width d2 of the LDD regions is set to be 1.3 μm. Then, a pixel TFT in which the interval d1 between the adjacent gate electrodes is set to 3 μm (LDD regions: 1 μm×2 and high concentration impurity region: 1 μm) is manufactured and results obtained by measuring on current values and off current values in the TFTs are similarly indicated in FIGS. 3 and 4.

Also, for comparison, a pixel including the TFT with the above B-type, that is, a pixel including the TFT in which only the low concentration impurity region is located between the two channel forming regions is produced. With respect to widths of respective portions in the channel direction, the widths of the gate electrode and the channel forming region are respectively set to be 2 μm and the width d2 of the LDD regions is set to be 1.3 μm. Then, respective pixel TFTs in which the interval d1 between the adjacent gate electrodes is set to 1 μm and 2 μm are manufactured and results obtained by measuring on current values and off current values in the TFTs are indicated in FIGS. 3 and 4.

Also, occurrence ratios of off current anomaly in the respective TFTs are obtained. With respect to a sample in which 12×17 pixels are located in matrix, a ratio of the number of pixels in which an off current exceeds 100 fA is obtained as an occurrence ratio of a pixel with an abnormal off current value. As a result, 1.9% is obtained in the present invention, 2.7% is obtained in the A-type, and 23% is obtained in the C-type. Thus, the lowest occurrence ratio of off current anomaly is obtained in the TFT structure of the present invention. In other words, according to the TFT structure of the present invention, the occurrence ratio of off current anomaly of the TFT can be reduced to lead to the improvement of a yield.

It is very useful to apply the TFT structure of the present invention, which is capable of suppressing a deterioration of the TFT characteristic by incidence light into a TFT due to various factors (natural light, multiple reflection, diffraction light, light from a light source, return light, and the like), to a pixel TFT and a TFT of a driver portion which are mounted in a liquid crystal display module. In addition, from the similar reason, it is also very useful to use the TFT structure of the present invention for a light emitting display device including an EL (electro-luminescence) element and a contact type image sensor.

Also, although the case of using the substrate with the insulating surface is described, a semiconductor substrate can be used.

Embodiment Mode 2

Figure 2A:
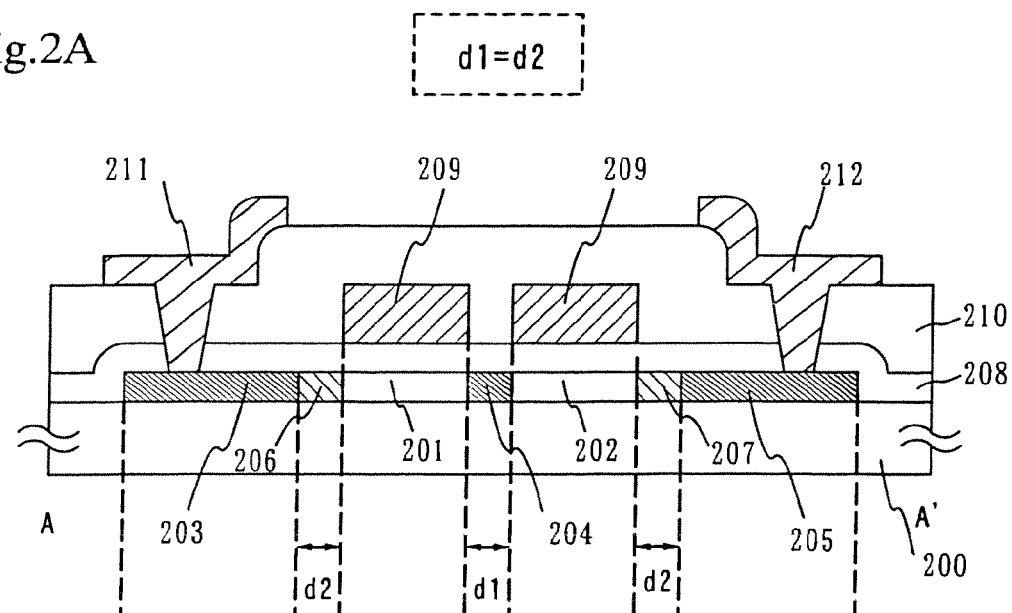
FIGS. 2A and 2B are a cross sectional view and a top view according to the present invention (Embodiment Mode 2)
Figure 2B:
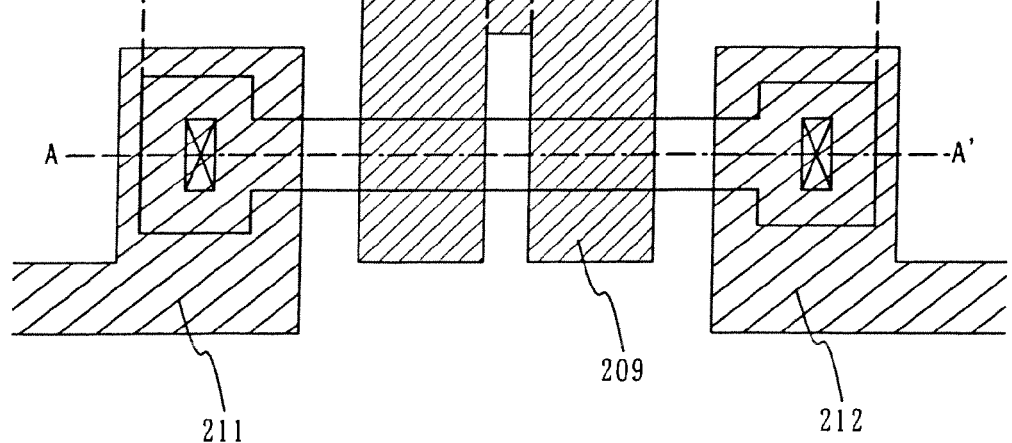

Although the example in which d1<d2 is set is indicated in Embodiment Mode 1, one example in the case where Embodiment Mode 2 of the present invention in which d1=d2 is set is applied to a TFT with a double gate structure is shown in FIGS. 2A and 2B and described below.

In FIGS. 2A and 2B, reference numeral 200 denotes a substrate, 201 and 202 denote channel forming regions, 203 and 205 denote a source region and a drain region, 204 denotes a high concentration impurity region, 206 and 207 denote low concentration impurity regions (LDD regions), 208 denotes a gate insulating film, 209 denotes gate electrodes, 210 denotes an interlayer insulating film, and 211 and 212 denote a source electrode and a drain electrode. Note that FIG. 2A is a cross sectional view taken along a dotted line A-A' of FIG. 2B which is a top view of a TFT.

The present invention is characterized in that only the high concentration impurity region 204 is formed as a region sandwiched by the two channel forming regions 201 and 202. An interval d1 between the adjacent gate electrodes 209, that is, a width of the high concentration impurity region in a channel length direction is designed to be the same length as a width d2 of the low concentration impurity regions 206 and 207. Thus, the interval between the two channel forming regions can be shortened and an area occupied by the TFT in one pixel can be reduced. In addition, since the region sandwiched by the two channel forming regions is the high concentration impurity region, light sensitivity in the case where light is incident into a TFT for some reason is reduced while the resistance of the entire semiconductor layer of the TFT which is in an on state is reduced.

Embodiment Mode 3

Figure 21:
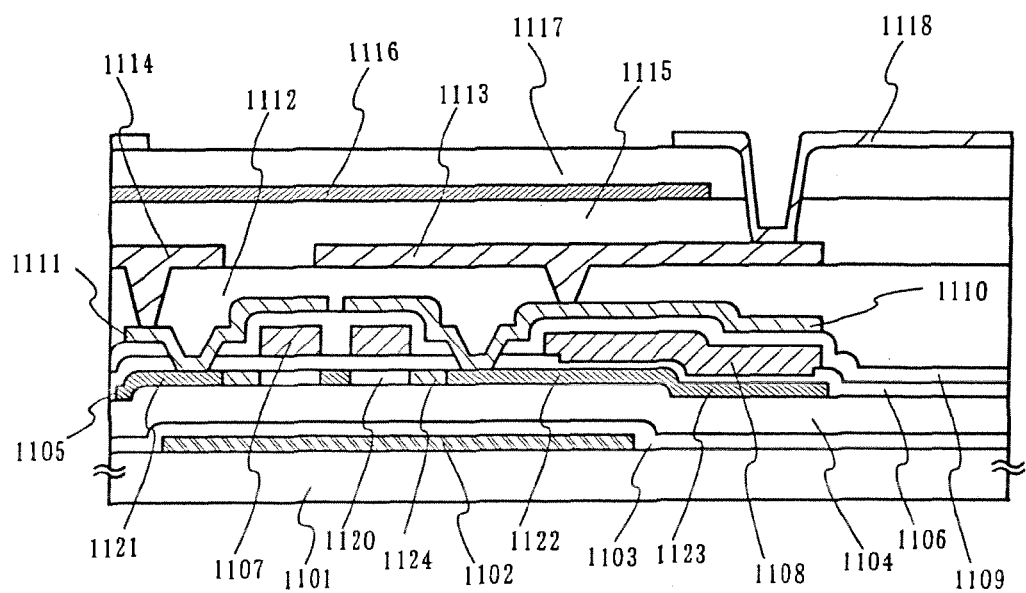
FIG. 21 is a cross sectional view of a thin film transistor and pixel structure according to Embodiment Mode 3.

This embodiment mode is indicated in FIG. 21. A first light shielding layer 1102 is formed to correspond to a channel forming region of a semiconductor layer 1105 on a substrate 1101. The first light shielding layer 1102 is formed of a non-translucent material with a heat resistance such as W, Ta, Ti, or silicide thereof. The non-translucent material is selected to keep stability with respect to a thermal treatment step at 500° C. or higher which is performed for the semiconductor layer and the like as a later step. A first insulating layer is formed from a silicon oxynitride film 1103 and a silicon oxide film 1104. The surface of the silicon oxide film may be leveled by chemical mechanical polishing (CMP).

The semiconductor layer 1105 is formed from a polycrystalline semiconductor layer obtained by crystallizing an amorphous semiconductor film using thermal treatment and have a thickness of about 30 nm to 750 nm. A second insulating film 1106 is formed from a silicon oxide film with a thickness of 30 nm to 100 nm on the semiconductor layer 1105, and thinned in a capacitor element. A gate electrode 1107 and a capacitor wiring 1108 are formed from the same layer and a third insulating layer 1109 of a silicon oxide film with a thickness of 150 nm to 200 nm is formed thereon.

Second light shielding layers 1110 and 1111 are also used as electrodes for forming contact with the source and the drain. In particular, the second light shielding layer 1110 is formed over the capacitor wiring 1108 and composes the capacitor element. The second light shielding layers 1110 and 1111 are extended over the gate electrode 1107 and also serves as light shielding layers. In this case, when the thickness of the third insulating layer 1109 is set to be 150 nm to 200 nm, the amount of incidence light into the semiconductor layer 1105 is reduced even though diffraction light is rounded. Further, there is an effect that a capacitance of the capacitor element is increased.

A channel forming region 1120, source and drain regions 1121 and 1122, and LDD regions 1124 are formed in the semiconductor layer 1105. A semiconductor region 1123 extended from the source region or the drain region 1122 serves as one electrode of the capacitor element.

According to the structure shown in FIG. 21, the second light shielding layers 1110 and 1111 are formed over the LDD regions 1124 in which a relatively large variation in conductivity is caused by a photoconductive effect to become light shielding layers. Thus, almost all stray light can be blocked. A fourth insulating layer 1112, source and drain wirings 1113 and 1114, a fifth insulating layer 1115, a third light shielding layer 1116, a sixth insulating layer 1117, and a pixel electrode 1118 are formed on the second light shielding layers 1110 and 1111.

According to the structure of the present invention, stray light including diffraction light can be completely blocked. However, it is concerned that the second light shielding layers overlap immediately above the LDD regions 1124 to change electric field distributions of the LDD regions 1124 and cause the influence on a characteristic of a TFT.

Figure 23A:
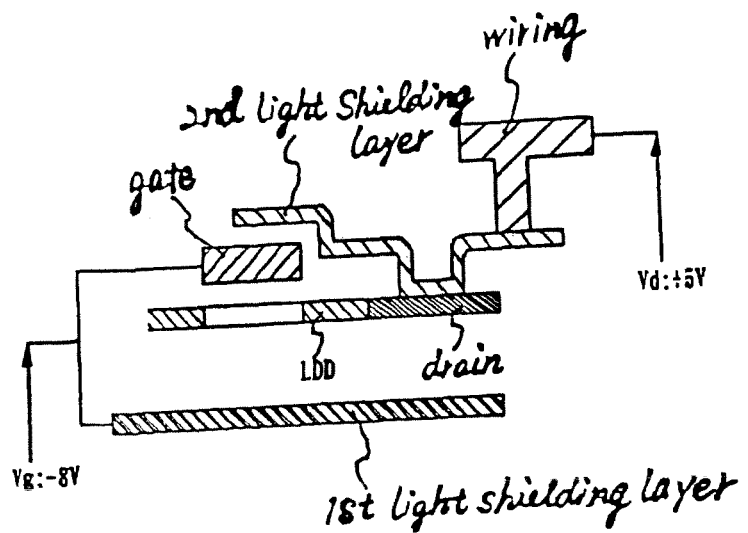
FIGS. 23A and 23B show a result obtained by simulating an electric field strength distribution of an LDD region in a structure of the present invention.
Figure 23B:
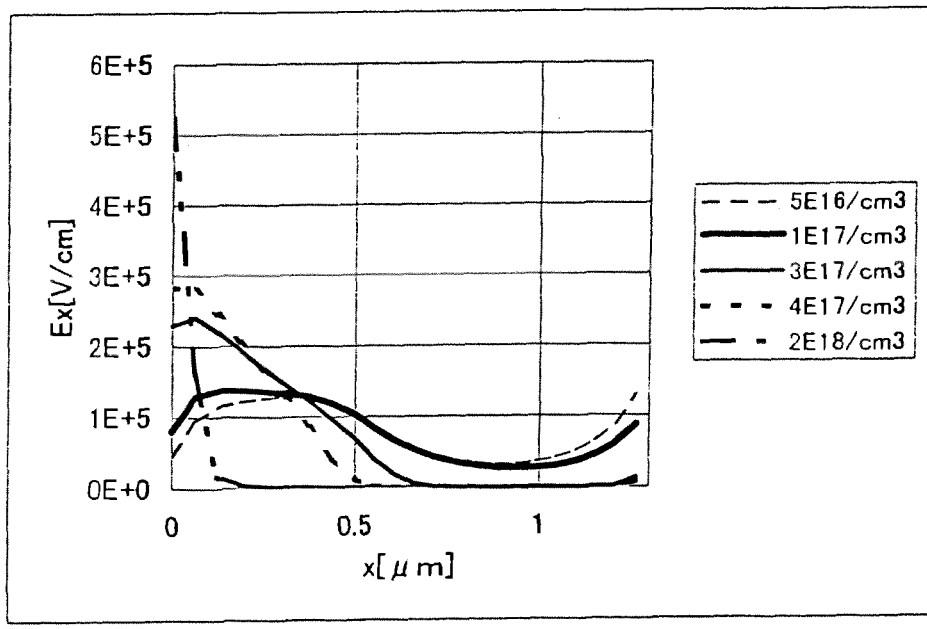
Figure 24A:
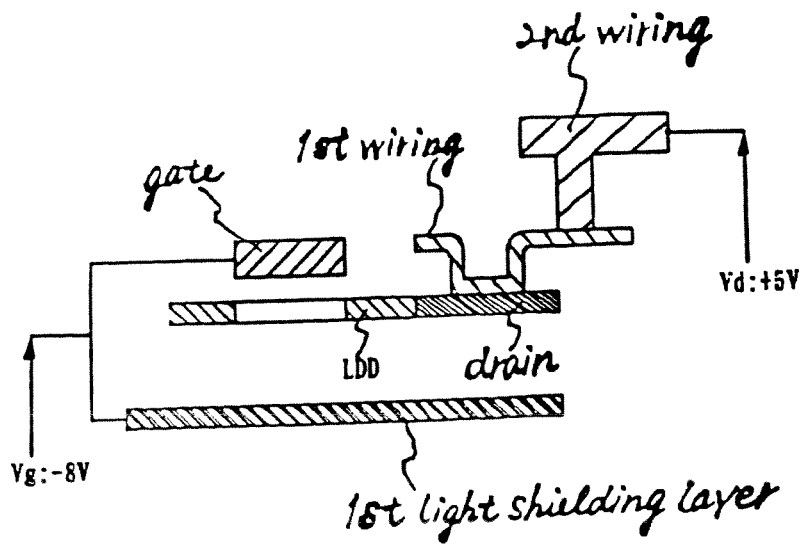
FIGS. 24A and 24B show a result obtained by simulating an electric field strength distribution of an LDD region in a conventional structure.
Figure 24B:
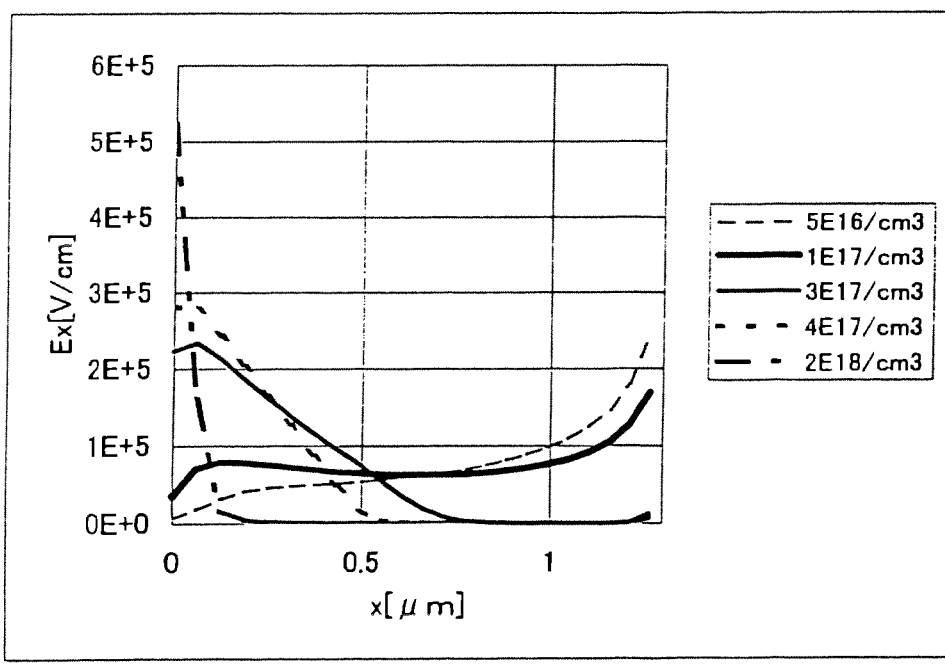

FIGS. 23A and 23B show a result obtained by simulating an electric field strength distribution in a transverse direction of the LDD region in the structure of the present invention which is similar to the structure shown in FIG. 21. FIG. 23A shows an element structure used for calculation. An interval between the first light shielding layer and the LDD region is set to be 580 nm, a thickness of the gate insulating film is set to be 80 nm, and an interval between the LDD region and the second light shielding layer is set to be 180 nm. A gate voltage is −8 V and a drain voltage is +5 V. FIGS. 24A and 24B show a result obtained by a similar simulation in a conventional structure in which the second light shielding layer is not located immediately over the LDD region.

Figure 25:
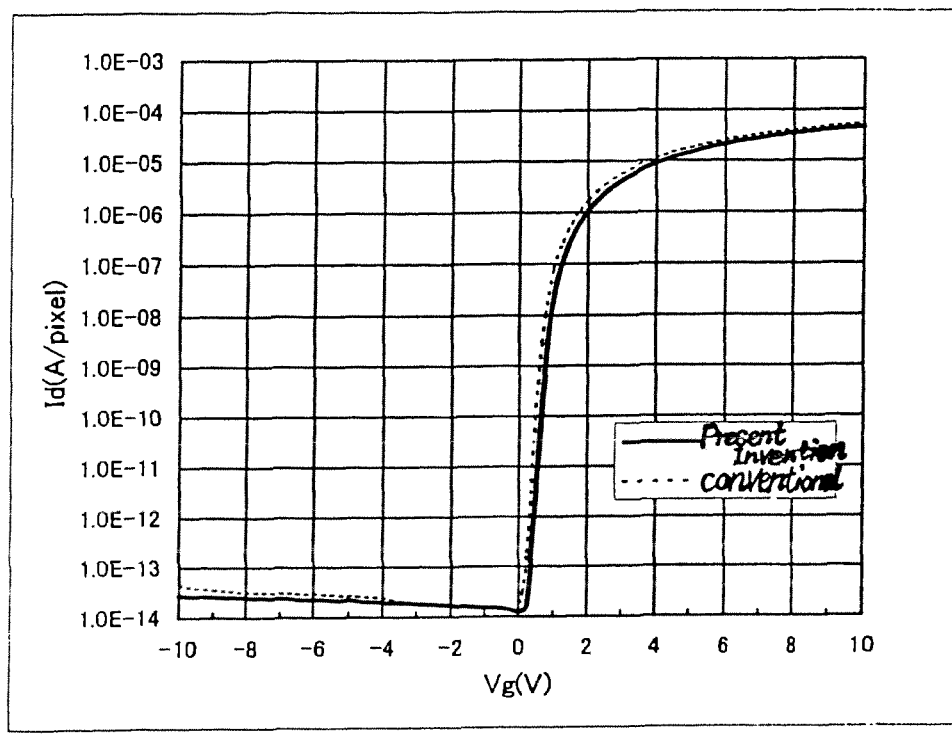
FIG. 25 is a graph indicating static characteristics of a TFT in the structure of the present invention and the conventional structure.

When FIG. 23B is compared with FIG. 24B, it is clear that an electric field strength of the LDD portion in an end portion of the gate electrode is increased by the influence of the electric field from the second light shielding layer in the case of using the structure of the present invention. However, when the influence is examined for a prototyped TFT, it is proved that an off current is not almost increased as shown in FIG. 25. Thus, it is found that the light shielding property can be improved without deteriorating a characteristic of a TFT according to the structure of the present invention.

Embodiment Mode 4

Figure 26:
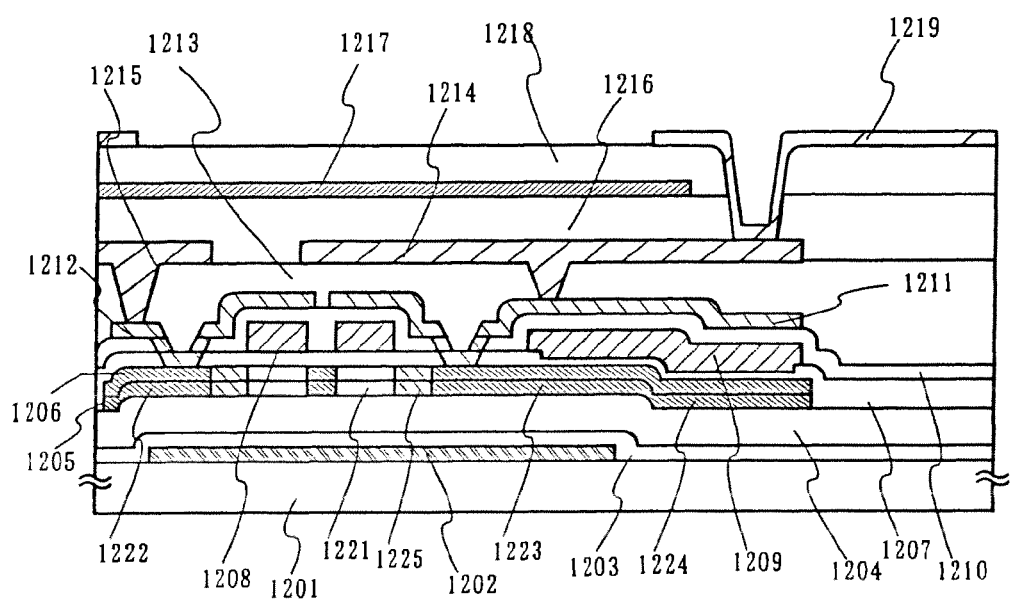
FIG. 26 is a cross sectional view of a thin film transistor and pixel structure according to Embodiment Mode 4.

FIG. 26 shows a cross sectional structure of a pixel according to the present invention and a structure in which a TFT and a pixel electrode and a capacitor portion which are connected with the TFT are formed. A first light shielding layer 1202 is formed on a substrate 1201 to correspond to a channel forming region of an active layer of a crystalline semiconductor film.

The first light shielding layer 1202 is formed of a non-translucent material with a heat resistance such as W, Ta, Ti, or silicide thereof. The non-translucent material is selected to keep stability with respect to a thermal treatment step at 500° C. or higher which is performed for the semiconductor layer and the like as a later step. A first insulating layer is formed from a silicon oxynitride film 1203 and a silicon oxide film 1204. The surface of the silicon oxide film may be leveled by chemical mechanical polishing (CMP).

The active layer is formed from at least two layers of polycrystalline semiconductor films. A first crystalline semiconductor film 1205 is formed at a thickness of about 30 nm to 300 nm by crystallizing an amorphous semiconductor film using thermal treatment.

Further, an amorphous semiconductor film is formed at a thickness of 30 nm to 300 nm on the first crystalline semiconductor film 1205 and crystallized by irradiation of laser light to form a second crystalline semiconductor film 1206. A solid laser oscillating device, a gas laser oscillating device, or a metallic laser oscillating device can be applied as a light source for laser light. A continuous oscillation solid laser device is most preferable. A continuous oscillation YAG laser, a $YVO_4$ laser, a YLF laser, a $YAlO_3$ laser, a glass laser, a ruby laser, an alexandrite laser, or a Ti: sapphire laser can be applied.

Also, it is desirable that laser light is converted into harmonic by a non-linear optical element. For example, it is known that the YAG laser emits laser light with a wavelength of 1065 nm as a fundamental wave. Since an absorption coefficient of the laser light to a semiconductor film is low, it is difficult to crystallize only an amorphous semiconductor film without damaging an insulating film formed as a base film and a substrate. When the second harmonic (532 nm), the third harmonic (355 nm), the fourth harmonic (266 nm), or the fifth harmonic (213 nm) is produced by a non-linear optical element without using a fundamental wave and laser light with such a wavelength is irradiated, only an amorphous semiconductor film is selectively heated for crystallization in accordance with a light absorption coefficient of a semiconductor film.

The crystalline semiconductor films formed by such two-step crystallization processing is a film which has a large grain size and a small crystal defect, and has a similar characteristic to a single crystal in a crystal grain. When the second crystalline semiconductor film is formed, the first crystalline semiconductor film becomes a protective film at laser irradiation and serves to relax an internal stress to a different kind of lower portion film. In addition, the influence of lattice unconformity at a connection portion between the first crystalline semiconductor layer and the second crystalline semiconductor film is small. Thus, even when the active layer of the TFT is formed by laminating two layers, there is no case where the influence is caused by the difference between layers. By selective crystallization to form the second crystalline semiconductor film, the alternation of the light shielding films due to the irradiation of laser light is prevented, and diffuse reflection of the laser light reflected from the light shielding film formed at the lower layer side of the first crystalline semiconductor film is prevented. Therefore, the crystalline semiconductor films with no distortion can be formed.

A second insulating film 1207 of a silicon oxide film with a thickness of 30 nm to 100 nm is formed on the semiconductor layer and thinned in a capacitor element. A gate electrode 1208 and a capacitor wiring 1209 are formed from the same layer and a third insulating layer 1210 of a silicon oxide film with a thickness of 150 nm to 200 nm is formed thereon.

Second light shielding layers 1211 and 1212 also serve as electrodes for forming contact with the source and the drain. In particular, the second light shielding layer 1211 is formed over the capacitor wiring 1209 to composes the capacitor element. The second light shielding layers 1211 and 1212 are extended over the gate electrode 1208 to improve the light shielding property. In this case, when the thickness of the third insulating layer is set to be 150 nm to 200 nm, the amount of incidence light into the active layer 1205 is reduced although diffraction light is rounded. Further, there is an effect that a capacitance of the capacitor portion is increased.

A channel forming region 1221, source and drain regions 1222 and 1223, and LDD regions 1225 are formed in the active layer. A semiconductor region 1224 extended from the source region or the drain region 1223 serves as one electrode of the capacitor element.

According to the structure shown in FIG. 26, the second light shielding layers 1211 and 1212 are formed over the LDD regions 1225 in which a relatively large variation in conductivity is caused by a photoconductive effect to become light shielding layers. Thus, almost all stray light can be blocked. A fourth insulating layer 1213, source and drain wirings 1214 and 1215, a fifth insulating layer 1216, a third light shielding layer 1217, a sixth insulating layer 1218, and a pixel electrode 1219 are formed on the second light shielding layers 1211 and 1212.

The present invention that provides the above structures is described in more detail based on the following embodiments.

Embodiment 1

Embodiment 1 of the present invention will be described with reference to FIGS. 5 to 8. Here a detailed description is given on a method of simultaneously forming on the same substrate a TFT for a pixel portion and TFTs (an n-channel TFT and a p-channel TFT) for driver circuits that are provided in the periphery of the pixel portion.

First, a base insulating film 301 is formed on a glass substrate 300, a first semiconductor film with crystalline structure is formed, and the semiconductor film is etched into desired shapes to form semiconductor layers 302 to 306 that are separated from one another like islands.

The base insulating film 301 provided on the glass substrate in Embodiment 1 has a two-layered structure. However, the base insulating film may be a single layer or three or more layers of insulating films. The first layer of the base insulating film 301 is a first silicon oxynitride film (composition ratio: Si=32%, O=27%, N=24%, H=17%) formed to have a thickness of 50 nm by plasma CVD with as reaction gas $SiH_4$, $NH_3$, and $N_2O$. The second layer of the base insulating film 301 is a second silicon oxynitride film (composition ratio: Si=32%, O=59%, N=7%, H=2%) formed to have a thickness of 100 nm by plasma CVD with as reaction gas $SiH_4$ and $N_2O$.

Next, an amorphous silicon film is formed on the base insulating film 301 by plasma CVD to a thickness of 50 nm. Then nickel acetate solution containing 10 ppm of nickel by weight is applied by a spinner to the semiconductor film. Instead of application, sputtering may be used to spray nickel element to the entire surface.

Next, heat treatment is performed to crystallize the amorphous semiconductor film to obtain the semiconductor film with crystalline structure. For this heat treatment, thermal treatment of the electric furnace or irradiation of strong light is used. In the case of using the thermal treatment of the electric furnace, the heat treatment is performed at 500 to 650° C. for 4 to 24 hours. The silicon film with a crystalline structure is obtained by performing the thermal treatment (550° C., four hours) for crystallization after the thermal treatment (500° C., one hour) for dehydration. In Embodiment 1, crystallization is performed by the thermal treatment using the furnace. However, crystallization can also be performed by the thermal treatment using the lamp anneal device.

Next, the semiconductor film is irradiated with the first laser light (XeCl: wavelength, 308 nm) in an atmosphere or an oxygen atmosphere to increase the crystallization ratio and repair defects remaining in the crystal grains. The laser light used is excimer laser light with a wavelength of 400 nm or less, or second harmonic or third harmonic of YAG laser. In either case, pulse laser light with a repetition frequency of about 10 to 1000 Hz is collected by an optical system into a beam of 100 to 500 mJ/cm$^2$, which irradiates the surface of the silicon film by scanning at an overlap ratio of 90 to 95%. Here, the first laser light is irradiated under conditions of a repetition frequency of 30 Hz and energy density 476 mJ/cm$^2$. The irradiation of the first laser light at this point is very important in order to remove or reduce a rare gas element (Ar, here) in the film. The oxide film formed by irradiating the first laser light and an oxide film formed by treating the surface with ozone water for 120 seconds together form a barrier layer that has a thickness of 1 to 5 nm in total.

On the barrier layer, an amorphous silicon film containing argon element as a gettering site is formed to have a thickness of 150 nm by sputtering. The conditions for forming the amorphous silicon film by sputtering in Embodiment 1 include setting the film formation pressure to 0.3 Pa, the gas (Ar) flow rate to 50 sccm, the film formation power to 3 kW, and the substrate temperature to 150° C. The amorphous silicon film formed under the above conditions contains argon element at an atomic concentration of $3\times10^{20}$ to $6\times10^{20}$/cm$^3$, and contains oxygen in an atomic concentration of $1\times10^{19}$ to $3\times10^{19}$/cm$^3$. Thereafter, a lamp annealing apparatus is used for thermal treatment at 650° C. for 3 minutes to perform gettering.

With the barrier layer as an etching stopper, the amorphous silicon film containing argon element, which is a gettering site, is selectively removed. The barrier layer is then selectively removed using diluted fluoric acid. It is desirable to remove the barrier layer that of oxide films after gettering since nickel tends to move into a region containing oxygen at a high concentration during gettering.

The second laser light is irradiated in a nitrogen atmosphere or vacuum atmosphere to smooth the surface of the semiconductor film. Excimer laser light with a wavelength equal to or less than 400 nm, or the second or the third harmonic of a YAG laser, is used for the laser light (the second laser light). In addition, light emitted from an ultraviolet light lamp may also be used as a substitute for the excimer laser light. Note that the energy density of the second laser light is made larger than the energy density of the first laser light, preferably from 30 to 60 mJ/cm$^2$ larger. Here, the second laser light is irradiated in an atmosphere with a repetition frequency of 30 Hz and energy density of 537 mJ/cm$^2$. The P–V value of the unevenness on the surface of the semiconductor film become equal to or less than 5 nm.

Although the second laser light is irradiated to the whole surface in Embodiment 1, at least a pixel portion may also be irradiated selectively since the reduction of off current is effective especially to TFTs of the pixel portion.

Next, a thin oxide film is formed by using ozone water on the surface of the obtained silicon film with a crystalline structure (also called a polysilicon film), and a resist mask is formed for etching to obtain the semiconductor layers with desired shapes, separated from one another like islands. After the semiconductor layers are obtained, the resist mask is removed.

In addition, in order to control the threshold (Vth) voltage of TFTs, the impurity element that gives the p-type or n-type conductivity may be doped to the semiconductor layers after forming the semiconductor layers. Impurity elements known to give semiconductor the p-type conductivity are Group 13 elements in the periodic table, such as boron (B), aluminum (Al), and gallium (Ga). Impurity elements known to give a semiconductor the n-type conductivity are Group 15 elements in the periodic table, such as phosphorus (P) and arsenic (As).

An etchant containing fluoric acid is used to remove the oxide film and wash the surface of the silicon film at the same time. Then, an insulating film mainly containing silicon as a gate insulating film 307 is formed. The gate insulating film in Embodiment 1 is a silicon oxynitride film (composition ratio: Si=32%, O=59%, N=7%, H=2%) formed by plasma CVD to have a thickness of 115 nm.

As shown in FIG. 5A, a first conductive film 308$a$ with a thickness of 20 to 100 nm, a second conductive film 308$b$ with a thickness of 100 to 400 nm, and a third conductive film 308$c$ with a thickness of 20 to 100 nm are layered on the gate insulating film 307. In Embodiment 1, a 50 nm thick tungsten film, a 500 nm thick Al—Ti (alloy of aluminum and titanium) film, and a 30 nm thick titanium film are layered on the gate insulating film 307 in the order stated.

Conductive materials for forming the first to third conductive films are elements selected from the group consisting of Ta, W, Ti, Mo, Al, and Cu, or alloy or compound materials mainly containing the above element. Alternatively, as the first to third conductive films, a polycrystalline silicon film represented by a semiconductor film doped with an impurity element such as phosphorus. For instance, the first conductive film may be a tungsten nitride film instead of the tungsten film, the second conductive film may be an Al—Si (alloy of aluminum and silicon) film instead of the Al—Ti (alloy of aluminum and titanium) film, and the third conductive film may be a titanium nitride film instead of the titanium film. It is not always necessary to have three layers of conductive films, and two layers of conductive films, a tantalum nitride film and a tungsten film, for example, may be employed.

As shown in FIG. 5B, resist masks 310 to 315 are formed with light exposure to conduct the first etching treatment for forming gate electrodes and wiring lines. The first etching treatment is conducted under first and second etching conditions. ICP (inductively coupled plasma) etching is employed. The films can be etched into desired taper shapes by using ICP etching and adjusting etching conditions (the amount of electric power applied to a coiled electrode, the amount of electric power applied to a substrate side electrode, the temperature of the substrate side electrode, etc.) suitably. Examples of etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

There is no limitation on selection of the etching gas, $BCl_3$, $Cl_2$, and $O_2$ are suitable here. The gas flow rate thereof is set to 65:10:5 (unit:sccm), and RF (13.56 MHz) electric power of 450 W is given to a coiled electrode at a pressure of 1.2 Pa to generate plasma for 117 second etching. The substrate side (sample stage) also receives RF (13.56 MHz) power of 300 W to apply substantially negative self-bias voltage. Under the first etching conditions, the Al film and the Ti film are etched and edge portions of the first conductive layer are tapered.

Switched to the second etching conditions, the etching gas is changed to $CF_4$, $Cl_2$, and $O_2$. The gas flow rate thereof is set to 25:25:10 (unit:sccm), and RF (13.56 MHz) power of 500 W is given to a coiled electrode at a pressure of 1 Pa to generate plasma for etching for about 30 seconds. The substrate side (sample stage) also receives RF (13.56 MHz) power of 20 W to apply substantially negative self-bias voltage. Under the second etching conditions with mixing $CF_4$ and $Cl_2$, the Al film, the Ti film, and the W film are etched to about the same degree. In order to perform etching without leaving any residue on the gate insulating film, the etching time is prolonged by approximately 10 to 20%.

In the first etching treatment, the edge portions of the first conductive layers, second conductive layers, and third conductive layers are tapered by forming the resist masks into proper shapes and by the effect of the bias voltage applied to the substrate. The angle of the tapered portions is 15 to 45°. First shape conductive layers 317 to 322 are thus formed from the first conductive layers, the second conductive layers, and the third conductive layers (the first conductive layers 317a to 322a, the second conductive layers 317b to 322b and the third conductive layers 317c to 322c) through the first etching treatment. Denoted by 316 is a gate insulating film and regions thereof that are not covered with the first shape conductive layers 317 to 322 are etched and thinned by about 20 to 50 nm.

Without removing the resist masks 310 to 315, second etching treatment is conducted next as shown in FIG. 5C. $BCl_3$ and $Cl_2$ are used as etching gas, the gas flow rate thereof is set to 20:60 (unit:sccm), and RF (13.56 MHz) power of 600 W is given to a coiled electrode at a pressure of 1.2 Pa to generate plasma for etching. The substrate side (sample stage) also receives RF (13.56 MHz) power of 100 W. Under these third etching conditions, the second conductive layers and the third conductive layers are etched. The aluminum film containing a minute amount of titanium and the titanium film are thus subjected to anisotropic etching under the third etching conditions to form second shape conductive layers 324 to 329 (the first conductive layers 324a to 329a, the second conductive layers 324b to 329b and the third conductive layers 324c to 329c). Denoted by 323 is a gate insulating film and regions thereof that are not covered with the second shape conductive layers 324 to 329 are etched and thinned slightly.

Without removing the resist masks, the first doping treatment is conducted to dope an impurity element that gives the n-type conductivity to the semiconductor layers. The doping treatment is performed with ion doping or ion implantation. In ion doping, the dose is set to $1.5 \times 10^{14}$ atoms/cm$^2$ and the acceleration voltage is set to 60 to 100 keV. Typically, phosphorus (P) or arsenic (As) is used as an impurity element that gives the n-type conductivity. In this case, the second shape conductive layers 324 to 328 serve as masks against the impurity element that gives the n-type conductivity and first impurity regions 330 to 334 are formed in a self-aligning manner. The first impurity regions 330 to 334 contain the impurity element that gives the n-type conductivity at a concentration of $1 \times 10^{16}$ to $1 \times 10^{17}$/cm$^3$.

Although the first doping treatment is conducted without removing the resist masks in Embodiment 1, the resist mask may be removed before the first doping treatment.

Figures 6A, 6B, 6C:
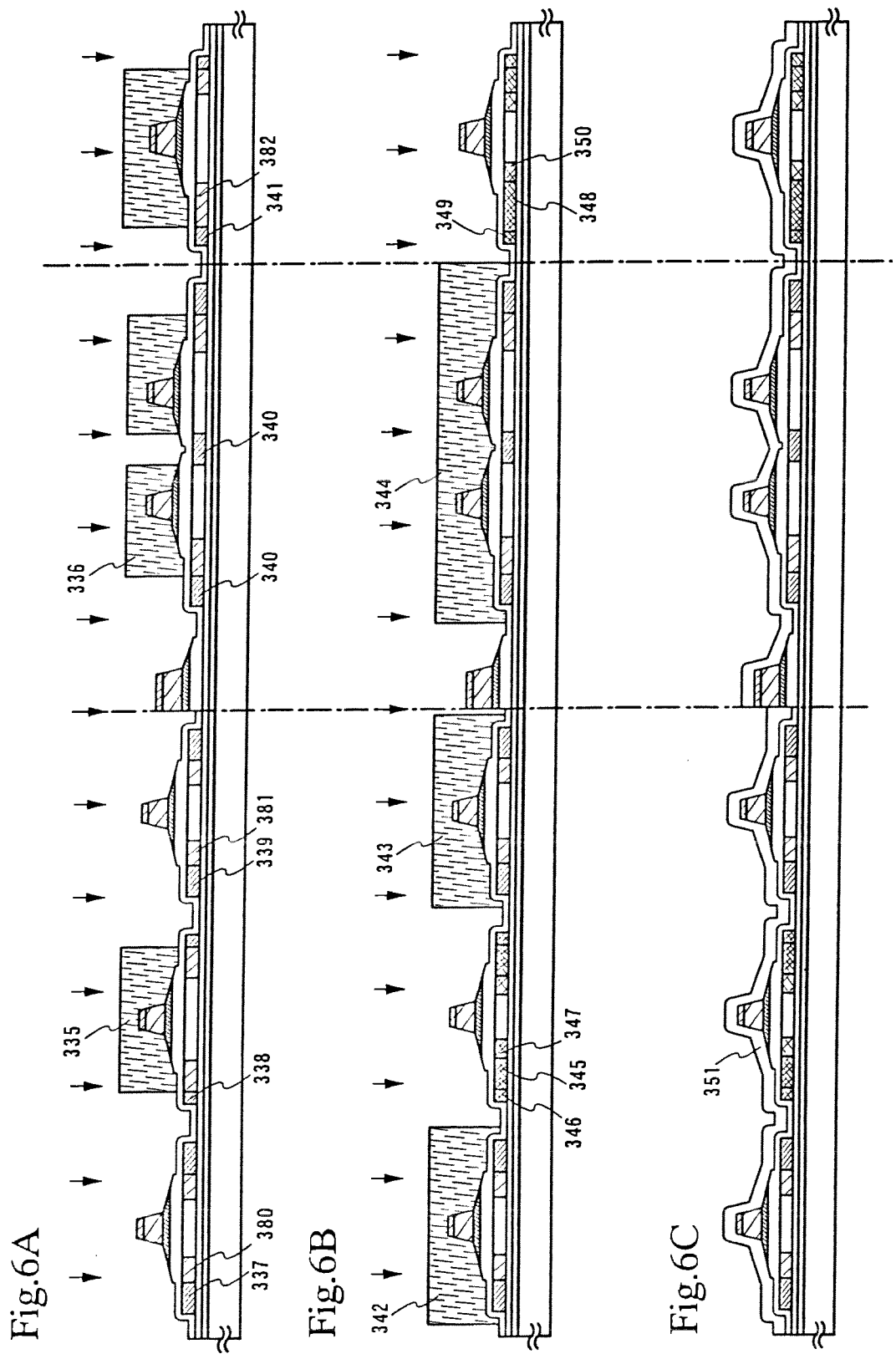
FIGS. 6A to 6C show steps of manufacturing the active matrix substrate.

After the resist masks are removed, resist masks 335 and 336 are formed as shown in FIG. 6A for second doping treatment. The mask 335 functions for protecting a channel formation region and its surrounding regions in the semiconductor layer that forms one of n-channel TFTs of the driver circuit, and the mask 336 functions for protecting a channel formation region and its surrounding regions in the semiconductor layer that forms a TFT of the pixel portion.

The second doping treatment employs ion doping to dope the semiconductor layers with phosphorus (P) with the dose to $1.5 \times 10^{15}$ atoms/cm$^2$ and the acceleration voltage to 60 to 100 keV. Here, impurity regions are formed in the semiconductor layers utilizing the difference in thickness of the second shape conductive layers 324 to 328 and the gate insulating film 323. The regions covered with the masks 335 and 336 are not doped with phosphorus (P). Second impurity regions 380 to 382 and third impurity regions 337 to 341 are thus formed. The third impurity regions 337 to 341 are doped with an impurity element that gives the n-type conductivity at a concentration of $1 \times 10^{20}$ to $1 \times 10^{21}$/cm$^3$. The second impurity regions are doped with the impurity element that gives the n-type conductivity at a lower concentration than in the third impurity regions due to the difference in thickness of the gate insulating film. The concentration of the impurity element in the second impurity regions is $1 \times 10^{18}$ to $1 \times 10^{19}$/cm$^3$. Regions to become storage capacitor can be covered with masks.

In a region placed between two channel formation regions of the pixel portion, only the third impurity region is formed in the second doping treatment. With such a structure, the resistance of the whole semiconductor layer in an ON state of TFT is decreased and ON current can be increased, and at the same time, the carrier life time by the light excitation generated in the high impurity element region is weak, and the light sensitivity can be decreased.

After the resist masks 335 and 336 are removed, resist masks 342 to 344 are newly formed as shown in FIG. 6B for the third doping treatment. Through the third doping treatment, a fourth impurity region 347 and fifth impurity regions 345 and 346 are formed in the semiconductor layer for forming the p-channel TFT. The fourth and fifth impurity regions are doped with an impurity element that gives the p-type conductivity. The fourth impurity region is formed in a region that overlaps one of the second shape conductive layers and is doped with an impurity element that gives the p-type conductivity at a concentration of $1 \times 10^{18}$ to $1 \times 10^{20}$/cm$^3$. The fifth impurity regions 345 and 346 are doped with an impurity element that gives the p-type conductivity at a concentration of $1 \times 10^{20}$ to $1 \times 10^{21}$/cm$^3$. The fifth impurity region 346 is doped with phosphorus (P) in the previous step. However, through the third doping treatment, the region 346 is doped with an impurity element that gives the p-type conductivity at 1.5 to 3 times higher concentration than the concentration of phosphorus, and therefore has the p-type conductivity.

Fifth impurity regions 348 and 349 and a fourth impurity region 350 are formed in the semiconductor layer for forming a storage capacitor in the pixel portion.

Through the above steps, the impurity regions with the n-type or p-type conductivity are formed in the respective semiconductor layers. The second shape conductive layers 324 to 327 serve as gate electrodes. The second shape conductive layer 328 serves as one of electrodes constituting the storage capacitor in the pixel portion. The second shape conductive layer 329 forms a source wiring line in the pixel portion.

Next, an insulating film (not shown in the drawing) is formed to cover the surface almost completely. The insulating film in Embodiment 1 is a silicon oxide film formed by plasma CVD to have a thickness of 50 nm. The insulating film is not limited to the silicon oxide film, and a single layer or a laminate layer of other insulating films that contains silicon may be used instead.

The next step is activation of the impurity elements doped in the semiconductor layers. The activation step is achieved by rapid thermal annealing (RTA) using a lamp light source, irradiation from the backside with YAG laser or excimer laser, or heat treatment using a furnace, or a combination of these methods. Since a material mainly containing aluminum is used for the second conductive layers in Embodiment 1, heating conditions in the activation step has to be set with taking into consideration the heat resistance of the second conductive layers.

During the activation treatment, the gettering, nickel used as a catalyst in crystallization is simultaneously moved to the third impurity regions 337, 339, and 340 and the fifth impurity regions 346 and 349 that contain high concentration of phosphorus. The concentration of nickel is reduced in the semiconductor layers for mainly forming channel formation regions. The TFTs that have the channel formation regions with the reduced nickel concentration have a lower OFF current value and provide high field effect mobility with a good crystallinity, and therefore excellent characteristics are achieved. In Embodiment 1, gettering has already been conducted once in accordance with the method shown in Embodiment Mode 1 in forming the semiconductor layers, gettering with phosphorus at this time is the second gettering. If the first gettering is performed sufficiently, the second time gettering is not particularly necessary.

Although the insulating film is formed before the activation in Embodiment 1, the insulating film may be formed after the activation.

Next, a silicon nitride film is formed as a first interlayer insulating film 351 and heat treatment (at 300 to 550° C. for 1 to 12 hours) is performed on the first interlayer insulating film to hydrogenate the semiconductor layers. (FIG. 6C) This step is performed for terminating dangling bonds in the semiconductor layers using hydrogen contained in the first interlayer insulating film 351. Irrespective of the presence or absence of the insulating film that is a silicon oxide film (not shown), the semiconductor layers can be hydrogenated. However, heating conditions in the hydrogenation step has to be set with taking into consideration the heat resistance of the second conductive layers since a material mainly containing aluminum is used for the second conductive layers in Embodiment 1. Other employable hydrogenation measures include plasma hydrogenation (which uses hydrogen excited by plasma).

On the first interlayer insulating film 351, a second interlayer insulating film 374 is formed from an organic insulating material. In Embodiment 1, an acrylic resin film with a thickness of 1.6 µm is formed. A contact hole reaching the source wiring line 327 and contact holes reaching respective impurity regions are formed next. In Embodiment 1, pluralities of etching processes are sequentially conducted. The contact holes are formed by etching the second interlayer insulating film with the first interlayer insulating film as an etching stopper, then etching the first interlayer insulating film with the insulating film (not shown) as an etching stopper, and then etching the insulating film (not shown).

Thereafter, wiring lines and a pixel electrode are formed using Al, Ti, Mo, W, or the like. It is desirable materials for the electrodes and pixel electrode are highly reflective materials such as a film mainly containing Al or Ag, or a laminate of a film mainly containing Al and a film mainly containing Ag. Thus formed are source or drain wiring lines 353 to 358, a gate wiring line 360, a connection wiring line 359, and a pixel electrode 361.

A driver circuit that has an n-channel TFT, a p-channel TFT, and an n-channel TFT, and a pixel portion that has an n-channel TFT and a storage capacitor are formed on the same substrate by the method described above. (FIG. 7) Such a substrate is called in this specification as an active matrix substrate for conveniences' sake.

Figure 7:
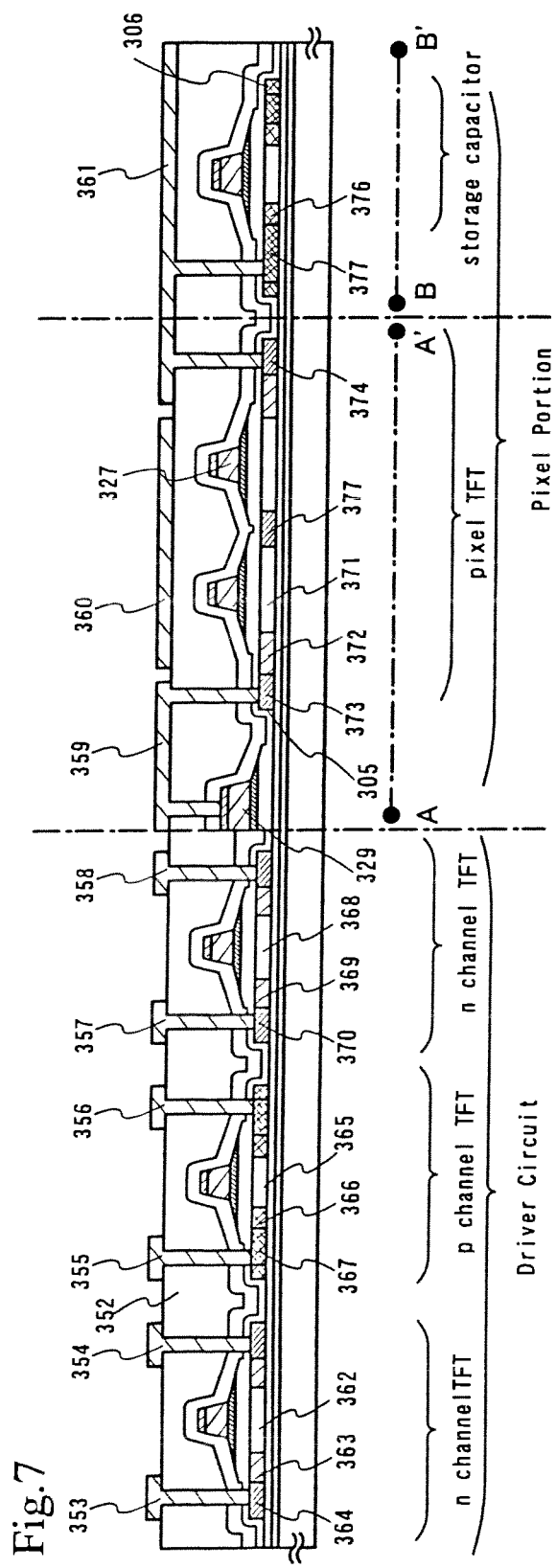
FIG. 7 shows a step of manufacturing the active matrix substrate.

In FIG. 7, the pixel TFT (first n-channel TFT) in the pixel portion has a channel formation region 371, a first impurity region 372 formed outside of the second shape conductive layer 327 that serves as a gate electrode, and a third impurity regions 373 and 374 that function as a source region or a drain region. In a region 377 placed between two-channel formation regions, phosphorus with the same concentration as that in a source region or drain region is doped. The width of the region 377 (width in the direction of channel formation region) is narrower than that of the first impurity region (width in the direction of channel formation region) that functions as LDD regions.

A fourth impurity region 376 and a fifth impurity region 377 are formed in the semiconductor layer that functions as one of the electrodes of the storage capacitor. The storage capacitor is composed of the second shape electrode 328 and the semiconductor layer 306 with an insulating film (the same film as the gate insulating film) as dielectric.

Figure 8:
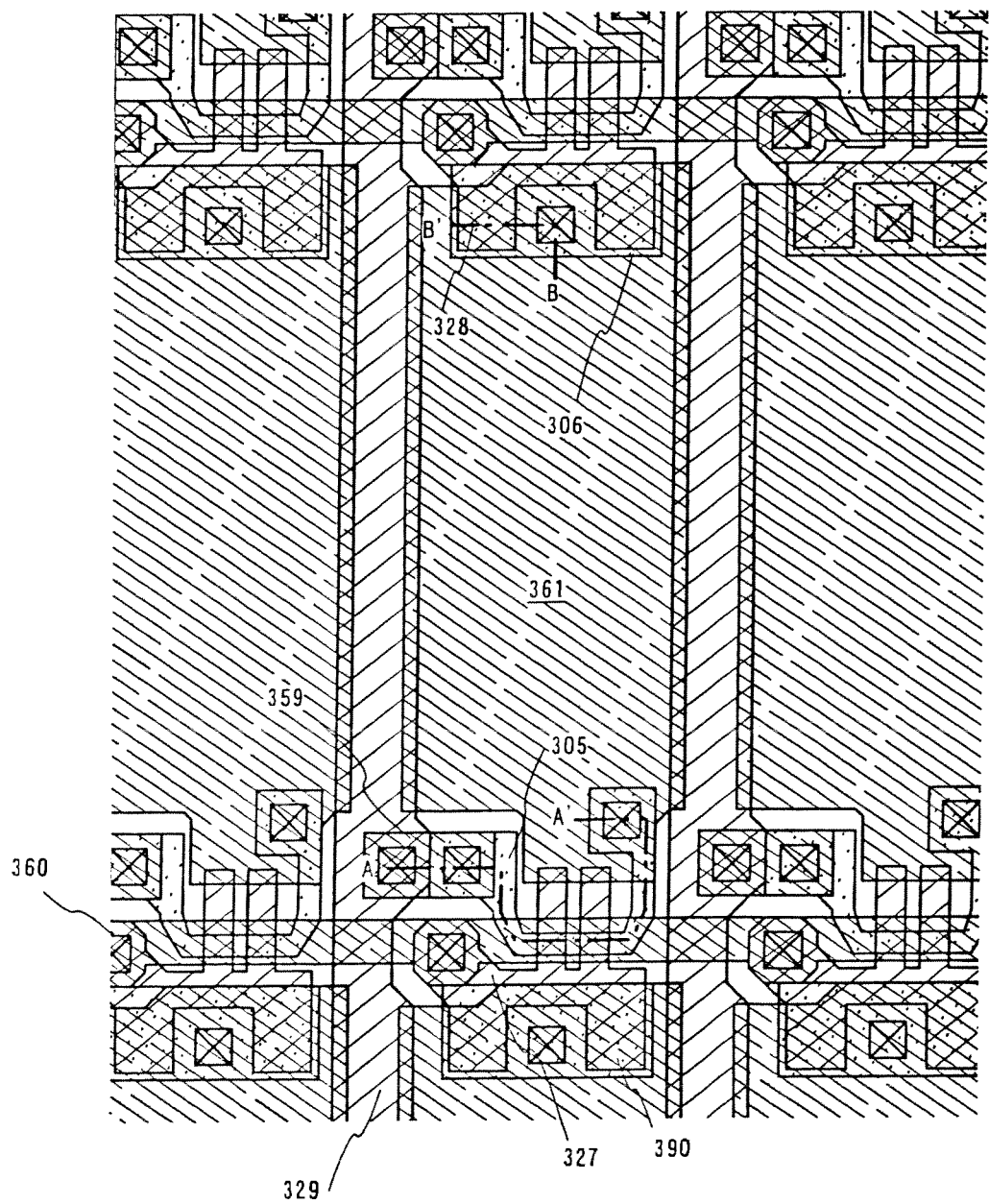
FIG. 8 is a top view of a pixel.

In FIG. 8, an example of top view of a pixel is shown. The cross sectional view taken along the line A-A' in FIG. 8 is corresponding to the line A-A' in FIG. 7. The cross sectional view taken along the line B-B' in FIG. 8 is corresponding to the line B-B' in FIG. 7. The same reference numbers as FIG. 7 are used in FIG. 8.

In FIG. 7, the n-channel TFT (second n-channel TFT) of the driver circuit has a channel formation region 362, a second impurity region 363 partially overlapping the second shape conductive layer 324 that serves as a gate electrode, and a third impurity region 364 that functions as a source region or a drain region. The p-channel TFT has a channel formation region 365, a fourth impurity region 366 partially overlapping the second shape conductive layer 325 that serves as a gate electrode, and a fifth impurity region 367 that functions as a source region or a drain region. The n-channel TFT (second n-channel TFT) has a channel formation region 368, a second impurity region 369 partially overlapping the second shape conductive layer 326 that serves as a gate electrode, and a third impurity region 370 that functions as a source region or a drain region. The n-channel TFTs and the p-channel TFT can be used to form a shift register circuit, a buffer circuit, a level shifter circuit, a latch circuit, and the like.

Embodiment 2

Embodiment 2 describes a process of manufacturing an active matrix liquid crystal display device from the active matrix substrate fabricated in Embodiment 1. The description is given with reference to FIG. 9.

After the active matrix substrate as illustrated in FIG. 15 is obtained in accordance with Embodiment 1, an orientation film is formed on the active matrix substrate of FIG. 15 and subjected to rubbing treatment. In this embodiment, before the orientation film is formed, an organic resin film such as an acrylic resin film is patterned to form columnar spacers for keeping an interval between substrates in desired positions. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driver circuit portion. A leveling film is formed to cover the color filter and the light-shielding layer. On the leveling film, an opposite electrode of a transparent conductive film is formed in the pixel portion. An orientation film is formed over the entire surface of the opposite substrate and is subjected to rubbing treatment.

Then the opposite substrate is bonded to the active matrix substrate on which the pixel portion and the driver circuits are formed, with a sealing member. The sealing member has filler mixed therein, and the two substrates are bonded with a uniform interval by the filler together with the columnar spacers. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces with desired shapes. The display device may be appropriately provided with a polarizing plate using a known technique. Then FPCs are attached using a known technique.

Figure 9:
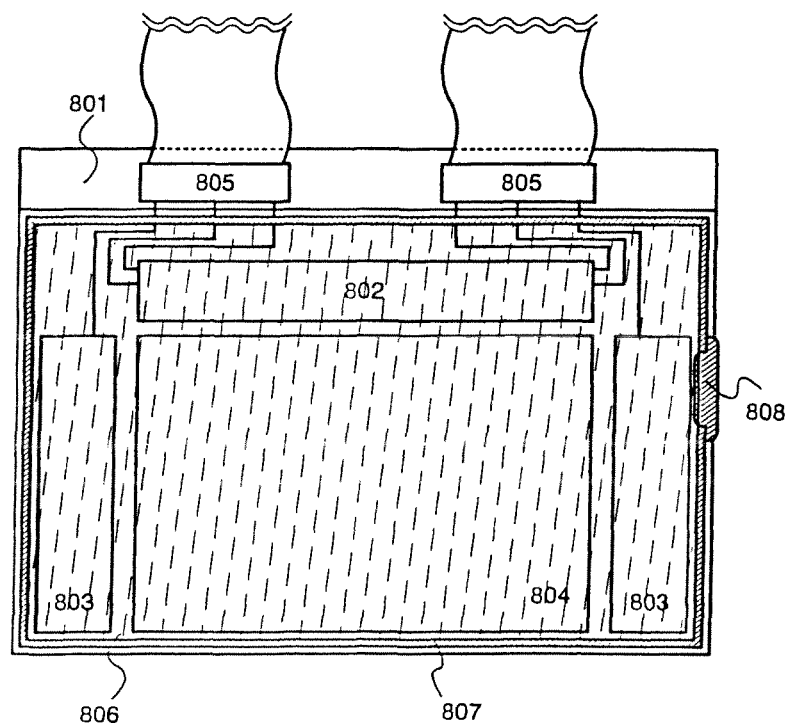
FIG. 9 shows an appearance of a liquid crystal module.

The structure of the thus obtained liquid crystal module is described with reference to the top view in FIG. 9.

A pixel portion 804 is placed in the center of an active matrix substrate 801. A source signal line driver circuit 802 for driving source signal lines is positioned above the pixel portion 804. Gate signal line driver circuits 803 for driving gate signal lines are placed in the left and right of the pixel portion 804. Although the gate signal line driver circuits 803 are symmetrical with respect to the pixel portion in Embodiment 2, the liquid crystal module may have only one gate signal line driver circuit on one side of the pixel portion. A designer can choose the arrangement that suits better considering the substrate size or the like of the liquid crystal module. However, the symmetrical arrangement of the gate signal line driver circuits shown in FIG. 9 is preferred in terms such as operation reliability and driving efficiency of the circuit.

Signals are inputted to the driver circuits from flexible printed circuits (FPC) 805. The FPCs 805 are press-fit through an anisotropic conductive film or the like after opening contact holes in the interlayer insulating film and resin film and forming a connection electrode 809 so as to reach the wiring lines arranged in given places of the substrate 801. The connection electrode is formed of ITO in this embodiment.

A sealing agent 807 is applied along a perimeter of the substrate in the periphery of the driver circuits and the pixel portion. Then, an opposite substrate 806 is bonded to the substrate 801 while a spacer formed in advance on the active matrix substrate keeps the gap between the two substrates constant. A liquid crystal element is injected through a portion that is not coated with the sealing agent 807. The substrates are then sealed by an encapsulant 808. The liquid crystal module is completed through the above steps.

Although all of the driver circuits are formed on the substrate here, several ICs may be used for some of the driver circuits.

This embodiment can be freely combined with Embodiment Modes 1 to 4 and Embodiment 1.

Embodiment 3

In this embodiment, an example of manufacturing a light emitting display device having an electro luminescence (EL) element is described.

A pixel portion, a source driver circuit, and a gate driver circuit are formed on a substrate (e.g., a glass substrate, a crystalline glass substrate or a plastic substrate) having an insulating surface. The pixel portion and the driver circuits can be obtained by a process in accordance with one of Embodiment Mode 1. The pixel portion and the driver circuit portions are covered with a layer of the sealing material and the sealing material is covered with the protective film. Further, the pixel portion and the driver circuit portions are enclosed between a covering member by using an adhesive. It is desirable that the covering member be formed from the same material as that of the substrate, for example, glass in order to resist deformation due to heat, external force, etc. The covering member formed from such a material is worked into a recessed shape (having a depth of 3 to 10 μm) by sandblasting or the like. It is desirable to also form a recess (having a depth of 50 to 200 μm) capable of accommodating a desiccant. If a plurality of the EL modules are manufactured on one substrate, the substrate and the covering member, after being bonded to each other, are cut by a $CO_2$ laser or the like so as to have the same cut end surfaces.

The structure of this embodiment as seen in the sectional view will next be described. An insulating film is provided on the substrate, and the pixel portion and the gate driver circuit are formed on the insulating film. The pixel portion is constituted by current control TFTs and a plurality of pixels including pixel electrodes electrically connected to the drains of the current control TFTs. The gate driver circuit is formed by using a CMOS circuit including a combination of an n-channel TFT and a p-channel TFT. TFTs circuits may be manufactured in accordance with any of Embodiment 1.

Each pixel electrode functions as an anode of an EL element. Banks are formed at the opposite ends of the pixel electrode. An EL layer and a cathode of the EL element are formed on the pixel electrode.

The EL layer (layer for emitting light and for moving carriers to emit light) may be formed by freely combining a light emitting layer, a charge transport layer or a charge injection layer, etc. For example, a low-molecular-weight organic EL material or a high-molecular-weight organic EL material may be used. As the EL layer, a thin film formed from a light emitting material (singlet compound) capable of emitting light (fluorescence) by singlet excitation or a thin film formed from a light emitting material (triplet compound) capable of emitting light (phosphorescence) by triplet excitation may be used. An organic material such as silicon carbide can be used as a charge transport layer or charge injection layer. The organic EL material and inorganic material for the above-described use may be selected from various well-known materials.

The cathode also functions as a wiring connected in common to all the pixels. The cathode is electrically connected to the FPC via connection wiring. All the devices contained in the pixel portion and the gate driver circuit are covered with the cathode, the sealing material and the protective film.

Preferably, a material having the highest possible transparency or translucence for visible light is used as the sealing material. In addition, preferably, the sealing material has the highest possible effect of limiting permeation of water and oxygen.

It is also preferable to provide the protective film formed of a DLC film or the like at least on the surface of the sealing material (exposed surface), after the light-emitting element has been completely covered with the sealing material. The protective film may be provided on the entire surface including the back surface of the substrate. In such a case, care must be exercised to avoid forming the protective film on the region where external input terminal (FPC) is provided. To avoid film forming on the external input terminal region, a mask may be used or the terminal region may be covered with a tape such as a Teflon tape used as a masking tape in CVD apparatus.

The EL element is enclosed in the above-described structure with the sealing material and the protective film to completely isolate the EL element from the outside and to prevent substances which promote degradation of the EL layer by oxidation, e.g., water and oxygen from entering the EL layer from the outside. Thus, the light-emitting device having improved reliability can be obtained.

Another construction may be formed in such a manner that the pixel electrode is used as a cathode and an anode is formed on the EL layer, light being emitted in a direction opposite to the emission direction.

This embodiment can be combined with one of Embodiment 1, Embodiment Mode 1 or Embodiment Mode 2.

Embodiment 4

A fabrication process of another top gate TFT, specifically, an active matrix substrate equipped with the top gate TFT including a light shielding layer by providing a gate wiring at the bottom of the semiconductor film explained. FIGS. 10A to 15B showing a top view of a part of the pixel portion and its sectional view are referred.

First, a conductive film is formed on a substrate 401 having an insulating surface and is patterned to form scanning lines 402 (FIG. 10A).

The scanning line 402 functions also as a light shielding layer for protecting an active layer that is to be later formed from light. The substrate 401 uses a quartz substrate. The scanning line 402 uses a laminate structure of a poly-silicon film (50 nm thick) and a tungsten silicide (W—Si) film (100 nm thick). The poly-Si film protects contamination of the substrate from tungsten silicide. Besides the quartz substrate, the substrate 401 may use a glass substrate or a plastic substrate. When the glass substrate is used, it may be heat-treated in advance at a temperature lower by about 10 to about 20° C. than a glass distortion point. An underlying layer formed from an insulating film such as a silicon oxide film, a silicon nitride film or a silicon oxynitride film is preferably formed on the surface of the substrate 401 on which TFT is formed, to prevent diffusion of impurities from the substrate 401. The scanning line 402 can use poly-Si doped with an impurity element for imparting a conductivity type or a conductive material such as $WSi_x$ (x=2.0 to 2.8), Al, Ta, W, Cr or Mo, or their laminate structure.

Next, insulating films 403a and 403b for covering the scanning lines 402 are formed to a thickness of 100 to 1000 nm (typically 300 to 500 nm) (FIG. 10B). Here, a silicon oxide film formed to a thickness of 100 nm by CVD and a silicon oxide film formed to a thickness of 280 nm by LPCVD are laminated.

After the insulating film 403b is formed, the surface of the insulating film may be chemically and mechanically polished (typically by CMP) and made flat. For example, the surface is leveled so that its maximum height (Rmax) is not greater than 0.5 μm, preferably not greater than 0.3 μm.

Next, an amorphous semiconductor film is formed to a film thickness of 10 to 100 nm. Here, the LPCVD process is used to form a 69 nm-thick amorphous silicon film. The technology disclosed in Japanese Patent Laid-Open No. 8-78329 is used to crystallize this amorphous semiconductor film. The reference discloses the technology that a metal element for promoting crystallization is selectively added to the amorphous silicon film and a crystalline silicon film is formed with expanding the addition region of the metal element as the starting point by heat-treatment. Nickel is used as the metal element for promoting crystallization. After heat-treatment (at 450° C. for one hour) is carried out for dehydrogenation, heat-treatment (at 600° C. for 12 hours) is conducted for crystallization. Next, a laser beam (XeCl: wavelength 308 nm) is irradiated to improve a crystallization ratio and to repair defects that are left inside crystal grains. An excimer laser beam having a wavelength of up to 400 nm or the second or third harmonic of YAG laser is used as the laser beam. In any case, a pulse laser beam having a repetition frequency of about 10 to about 1000 Hz is used, is condensed to 100 to 400 mJ/cm² by using an optical system, is irradiated with an overlap ratio of 90 to 95% to be scanned on the silicon film surface.

Next, Ni is gettered from a region that is to function as the active layer of TFT. This embodiment represents an example that uses a semiconductor film containing a rare gas element as the gettering method. In addition to the oxide film formed by irradiating the laser beam as described above, the film surface is then treated with ozone water for 120 seconds to form a barrier layer made of an oxide film having a total thickness of 1 to 5 nm. An amorphous silicon film containing an argon element as a gettering site is formed to a thickness of 150 nm on the barrier layer by a sputtering process. In the film formation condition of the sputtering process in this embodiment, a film formation pressure is 0.3 Pa, a gas (Ar) flow rate is 50 (sccm), film formation power is 3 kW, and a substrate temperature is 150° C. The atomic concentration of the argon element contained in the amorphous silicon film under the above condition is $3 \times 10^{20}/cm^3$ to $6 \times 10^{20}/cm^3$ and the atomic concentration of oxygen is $1 \times 10^{19}/cm^3$ to $3 \times 10^{19}/cm^3$. Heat-treatment is then carried out at 650° C. for 3 minutes by using a lamp annealing apparatus for gettering. An electric furnace may be used in place of the lamp annealing apparatus.

The amorphous silicon film containing the argon element as the gettering site is selectively removed by using the barrier layer as an etching stopper. Thereafter, the barrier layer is selectively removed by using dilute hydrofluoric acid. Since nickel is likely to migrate to a region having a high oxygen concentration during gettering, it is preferred to remove the barrier layer made of the oxide film after gettering.

Next, a thin oxide film is formed on the surface of the resulting silicon film having the crystalline structure (also called the "poly-silicon film") by using ozone water and a resist mask is formed thereon. The silicon film is etched to obtain a desired shape, and thus a semiconductor layer 404 isolated in an island shape is formed. The resist mask is removed after the semiconductor layer 404 is formed (FIG. 10C). FIG. 10D is a top view of the pixel after the semiconductor layer 404 is formed. A sectional view taken along a dotted line A-A' in FIG. 10D corresponds to FIG. 10C.

After the semiconductor layer is formed, an impurity element for imparting a p-type or an n-type may be added to control a threshold value (Vth) of TFT. The elements of the Group XIII of the Periodic Table such as boron (B), aluminum (Al) and gallium (Ga) are known as the impurity elements that impart the p-type to the semiconductor. The elements belonging to the Group XV of the Periodic Table typified by phosphorus (P) and arsenic (As) are known as the impurity elements that impart the n-type to the semiconductor.

Figure 11A:
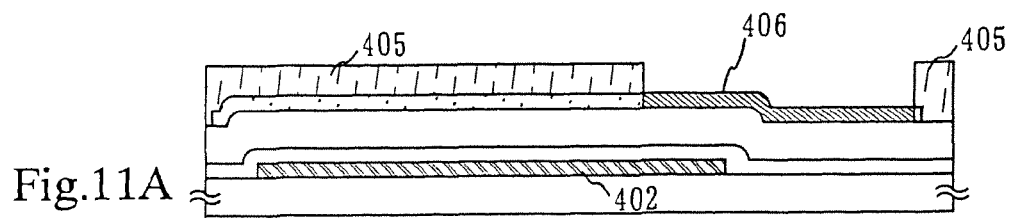
FIGS. 11A to 11D show steps of manufacturing the active matrix substrate.

Next, to form the storage capacitor, a mask 405 is formed and phosphorus is doped into a part of the semiconductor layer (region to function as the storage capacitor) 406 (FIG. 11A).

Figure 11B:
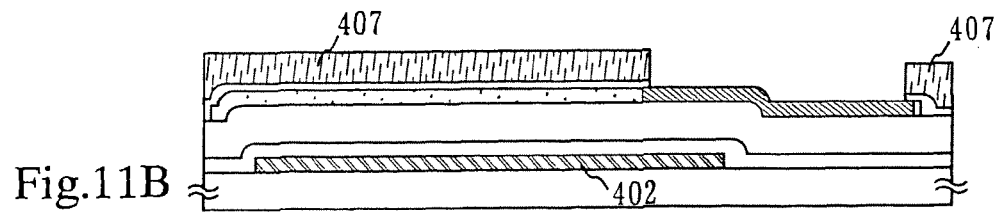

After the mask 405 is removed, an insulating film is formed in such a manner as to cover the semiconductor layer. A mask 407 is then formed, and the insulating film on the region 406 to function as the storage capacitor is removed (FIG. 11B).

Figure 11C:
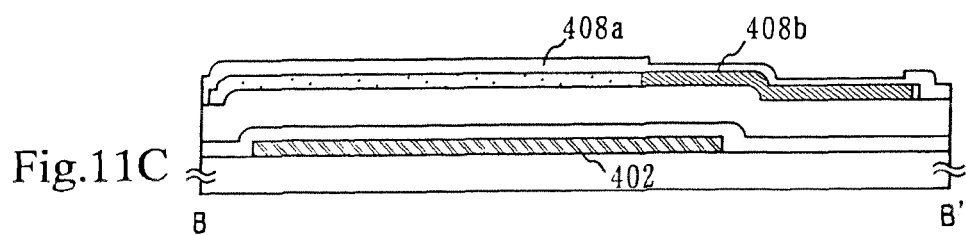
Figure 11D:
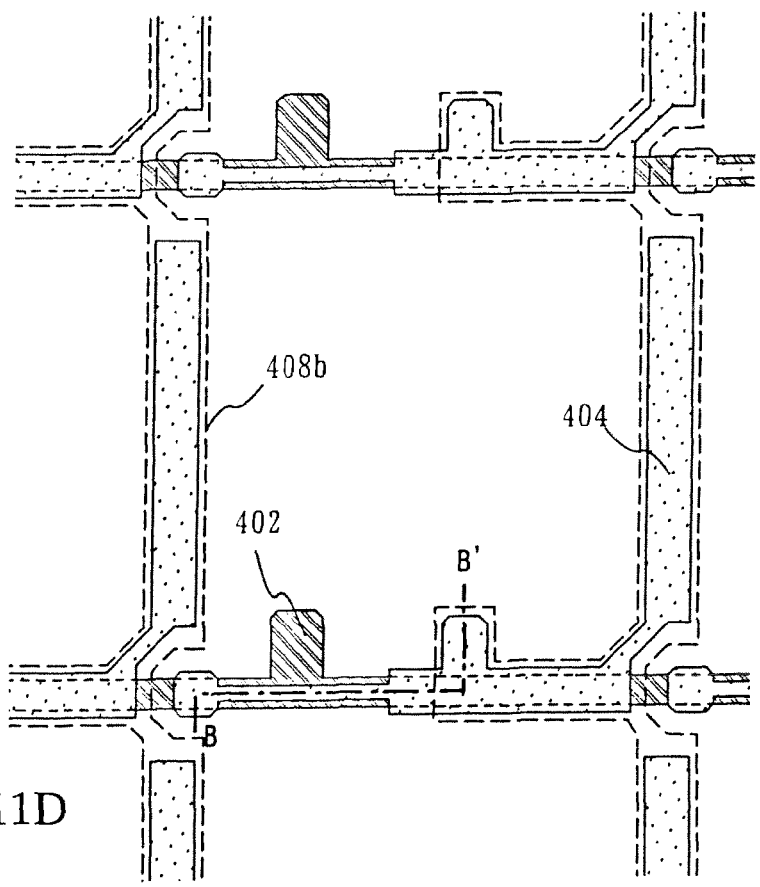

Next, the mask 407 is removed and thermal oxidation is carried out to form an insulating film (gate insulating film) 408a. Due to this thermal oxidation, the final film thickness of the gate insulating film becomes 80 nm. Incidentally, an insulating film 408b thinner than the other regions is formed on the region to function as the storage capacitor (FIG. 11C). FIG. 11D is a top view of the pixel at this stage. A sectional view taken along a dotted line B-B' in FIG. 11D corresponds to FIG. 11C.

Next, a channel dope step of adding a p-type or n-type impurity element in a low concentration to a region to function as a channel region of TFT is conducted either to the entire surface or selectively. This channel dope step is the one that controls the threshold voltage of TFT. Here, boron is doped by an ion dope method of plasma excitation of diborane ($B_2H_6$) without mass isolation. Needless to say, an ion implantation process with mass isolation may be carried out, too.

A mask 409 is formed on the insulating film 408a and the insulating films 403a and 403b, and contact holes are formed in such a manner as to reach the scanning lines 402 (FIG. 12A). The mask is removed after the contact holes are formed.

A conductive film is formed and is then patterned to give gate electrodes 410 and a capacitance wire 411 (FIG. 12B). This embodiment uses a laminate structure of a silicon film (150 nm thick) doped with phosphorus and tungsten silicide (150 nm thick) as the gate electrodes 410 and the capacitance wire 411. In this embodiment, a double gate structure is formed, and the space between adjacent gate electrodes (d1) is 1 µm. The storage capacitor composed of the capacitance wire 411 and a part of the semiconductor layer 406 by using the insulating film 408b as the dielectric.

Next, phosphorus is doped in a low concentration and in self-alignment with the gate electrode 410 and the capacitance wire 411 as the mask (FIG. 12C). FIG. 12D shows a top view of the pixel at this stage. In FIG. 12D, the sectional view taken along a dotted line C1-C1' and the sectional view taken along the line C2-C2' correspond to FIG. 12C. The phosphorus concentration doped in a low concentration is regulated to $1\times10^{16}$ to $5\times10^{18}$ atoms/cm$^3$, typically $3\times10^{17}$ to $3\times10^{18}$ atoms/cm$^3$.

Figure 13A:
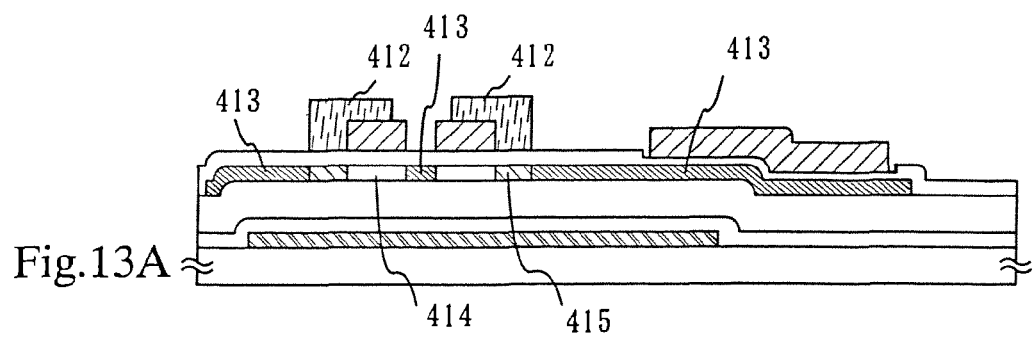
FIGS. 13A to 13C show steps of manufacturing the active matrix substrate.

A mask 412 is then formed and phosphorus is doped in a high concentration to form a high concentration impurity region 413 that is to function as a source region or a drain region (FIG. 13A). The phosphorus concentration in the high concentration impurity region is regulated to $1\times10^{20}$ to $1\times10^{21}$ atoms/cm$^3$ (typically $2\times10^{20}$ to $5\times10^{20}$ atoms/cm$^3$). Incidentally, a region of the semiconductor layer 404 overlapping with the gate electrode 410 is a channel formation region 414 and a region of the semiconductor layer 404 covered with the mask 412 is a low concentration impurity region 415 that is to function as an LDD region. In TFT of the pixel portion of this embodiment, mask 412 is not provided between adjacent gate electrodes and only high concentration impurity region (width 1 µm in the direction of the length of the channel formation) is formed between two channel formation regions in a self-alignment. The width d2 of the low impurity region is formed to 1.3 to 1.5 µm with the mask 412, and the interval (d1) of the adjacent gate electrodes is 1 µm. However, d1 and d2 are not limited to these values provided that d1<d2. TFT of the pixel portion and TFT of the driver circuit are formed on the same substrate in this embodiment. TFT of the driver circuit may be provided the low impurity region on both sides, and also the low impurity region on one side. Furthermore, the TFTs may not be provided the low impurity region on both sides. Examiners may appropriately design masks. After the impurity element is doped, the mask 412 is removed.

To form p-channel TFT used for a driver circuit formed over the same substrate as the pixels, a mask covers a region to function as n-channel TFT and boron is doped to form the source or drain region, though not shown in the drawing.

After the mask 412 is removed, a passivation film 416 is formed in such a manner as to cover the gate electrodes 410 and the capacitance wire 411. Here, a silicon oxide film is formed to a thickness of 70 nm. Heat-treatment is then carried out to activate the n-type or p-type impurity element doped in a respective concentration to the semiconductor layer. Here, heat-treatment is carried out at 850° C. for 30 minutes.

Figure 13B:
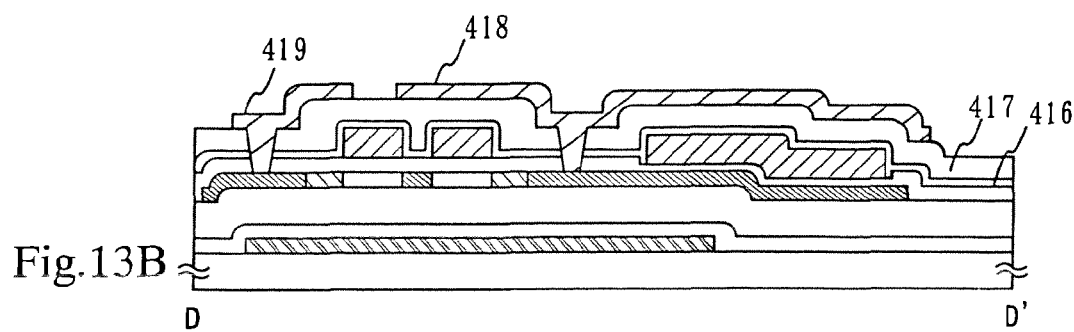
Figure 13C:
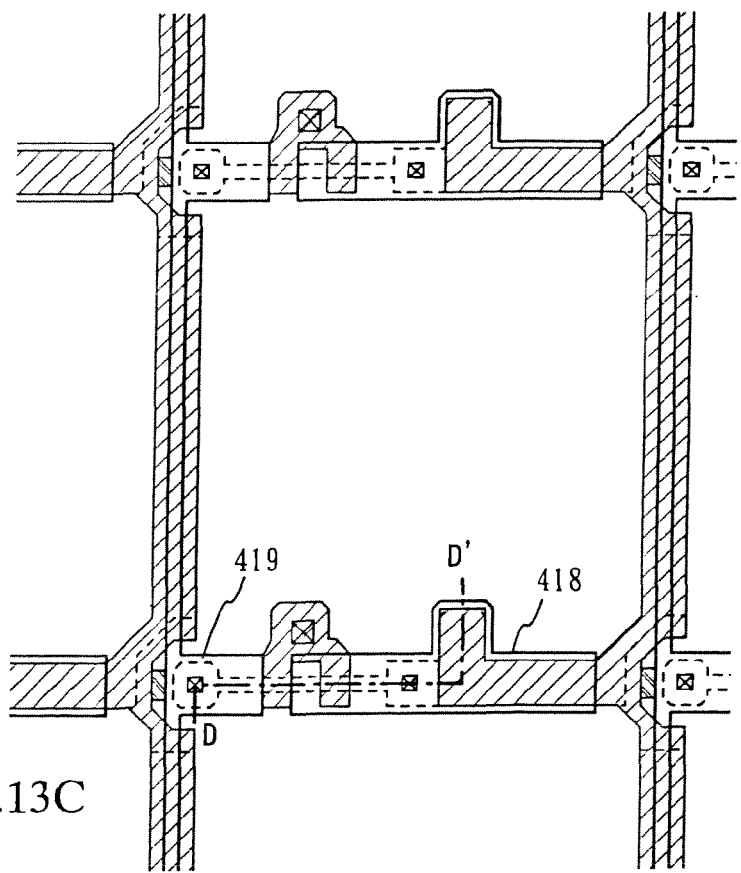

Next, an interlayer insulating film 417 made of an organic resin material is formed. This embodiment uses a 400 nm-thick acrylic resin film. After contact holes reaching the semiconductor layer are formed, the drain electrode 418 and the source line 419 are formed. In this embodiment, the drain electrode 418 and the source line 419 are made from a three-layered laminate film that a 100 nm-thick Ti film, a 300 nm-thick Ti-containing aluminum film and a 150 nm-thick Ti film are continuously formed by a sputtering process (FIG. 13B). The source line 419 and the drain electrode 418 cut off the light to the semiconductor layer as shown in FIG. 13B. The source line 419 and the drain electrode 418 cut off light diffracted at an end part of the light shielding layer that is to be later formed. Incidentally, the sectional view taken along a dotted line D-D' in FIG. 13C corresponds to FIG. 13B.

Figure 14A:
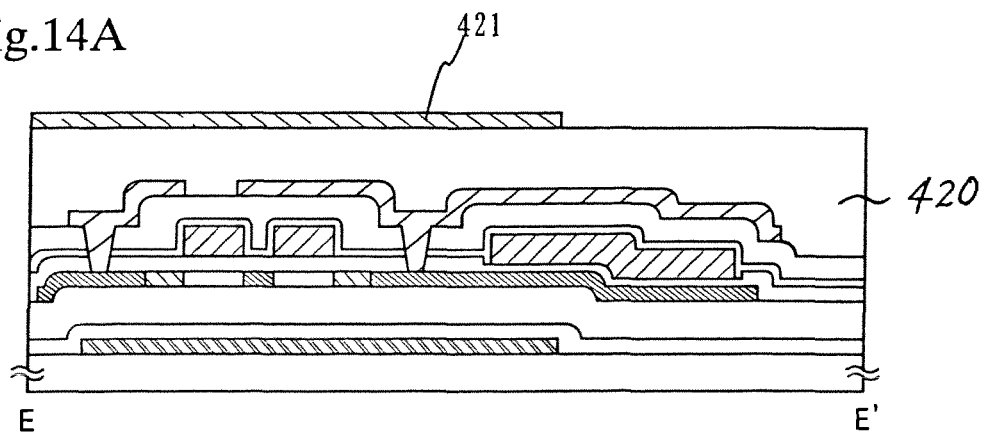
FIGS. 14A and 14B show steps of manufacturing the active matrix substrate.
Figure 14B:
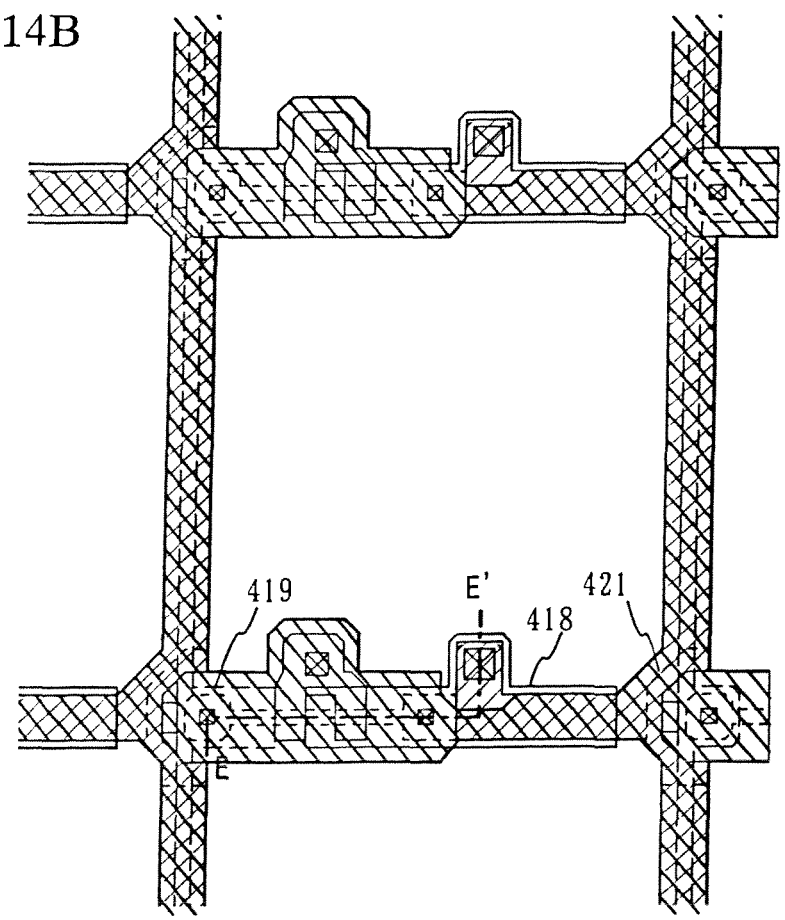

After hydrogenation treatment is conducted, an interlayer insulating film 420 made of an acrylic resin is formed. Next, a conductive film with a light shielding property is formed at a thickness of 100 nm on the interlayer insulating film 420 to form a light shielding layer 421 (FIG. 14A). The sectional view taken along a dotted line E-E' in FIG. 14B corresponds to FIG. 14A.

Figure 15A:
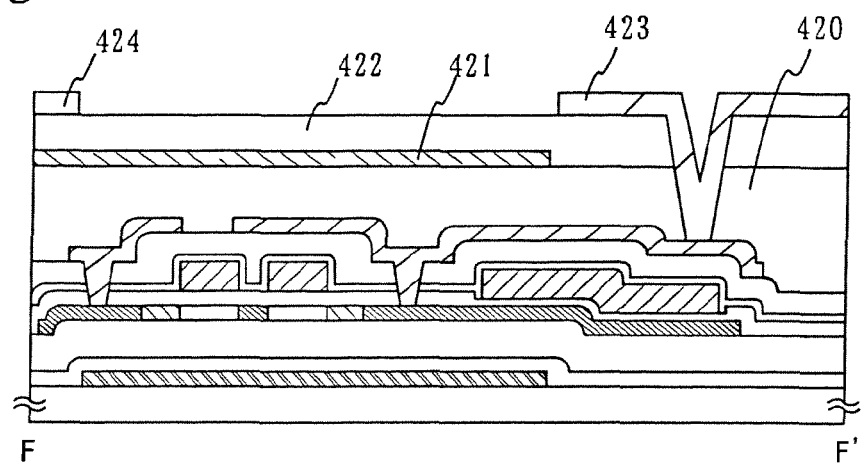
FIGS. 15A and 15B show steps of manufacturing the active matrix substrate.
Figure 15B:
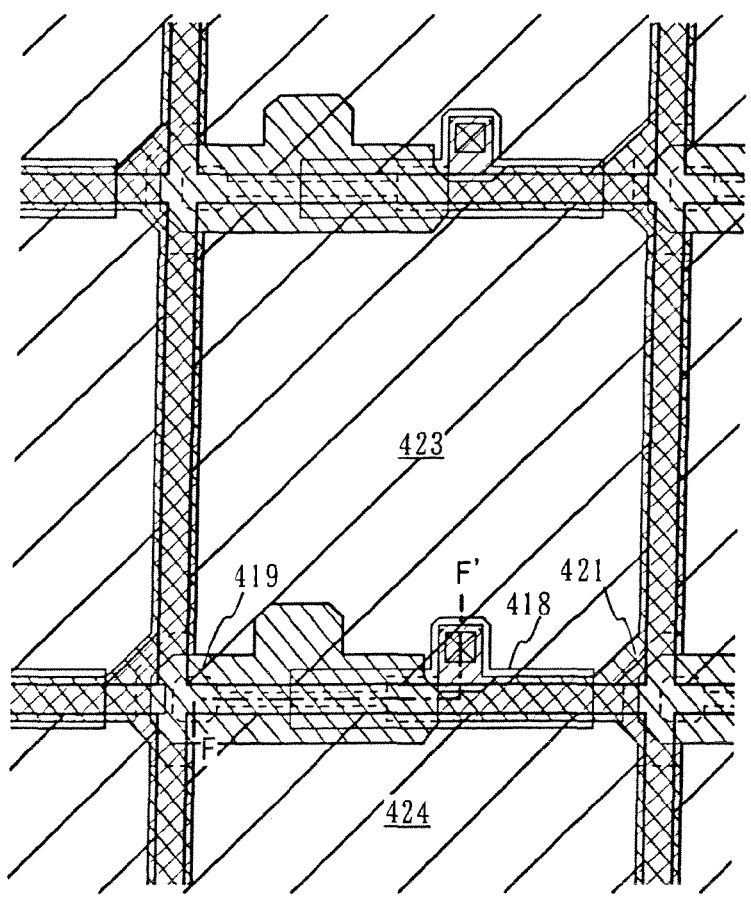

Next, an interlayer insulating film 422 is formed. Contact holes are then so formed as to reach the drain electrode 418. After a 100 nm-thick transparent conductive film (here, an indium oxide tin (ITO) film) is formed, it is patterned to form pixel electrodes 423 and 424 (FIG. 15A). The sectional view taken along a dotted lines F-F' in FIG. 15B corresponds to FIG. 15A.

In this way, the pixel TFT comprising the n-channel TFT is formed in the pixel portion while the area (aperture ratio 74.5%) of the display region (pixel size of 23 µm×23 µm) is secured, and a sufficient storage capacitor (55.2 fF) can be acquired.

Therefore, the n-channel TFT having a double gate structure, the pixel portion having a storage capacitor and the driver circuit having a n-channel TFT and p-channel TFT can be formed on the same substrate. In this specification, such substrate is referred to as an active matrix substrate in convenience' sake.

Further, OFF current of the obtained pixel TFT is so small that it is suitable for TFT of the pixel portion. The fluctuation becomes smaller of the TFT characteristics.

This embodiment represents one example, and the process steps of this embodiment are not naturally restrictive. For example, each conductive film can be made from an element selected from the group consisting of tantalum (Ta), titanium (Ti), molybdenum (Mo), tungsten (W), chromium (Cr) and silicon (Si), or an alloy film formed of the combination of these elements (typically, Mo—W alloy and Mo—Ta alloy). Each insulating film can use a silicon oxide film, a silicon nitride film, a silicon oxynitride film and organic resin materials (polyimide, acryl, polyamide, polyimideamide and BCB (benzocyclobutene)).

A manufacturing step of the active matrix substrate for a transparent display device by using a transparent conductive film to the pixel electrode is shown in this embodiment. However, the active matrix substrate for reflection display device may be formed by using materials having a reflection.

This embodiment can be combined with any of Embodiment Modes 1 to 4 and Embodiment 2.

Embodiment 5

The example in which the high concentration impurity region and the source region (or the drain region) have the same impurity concentration is indicated in the above Embodiment Mode 1 or the above Embodiment Mode 2. In this embodiment, an example in which the high concentration impurity region and the source region (or the drain region) have different concentrations is indicated in FIGS. 16 and 17.

Figure 16:
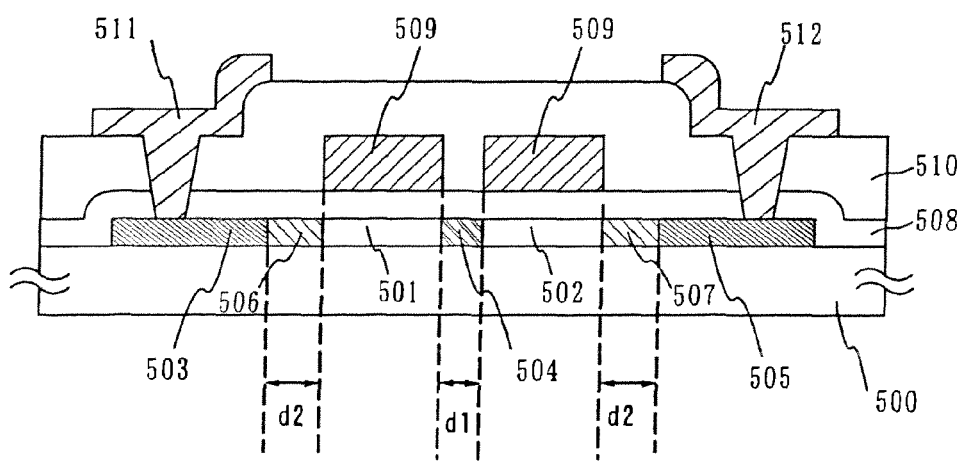
FIG. 16 is a cross sectional view according to the present invention (Embodiment 5)
Figure 17:
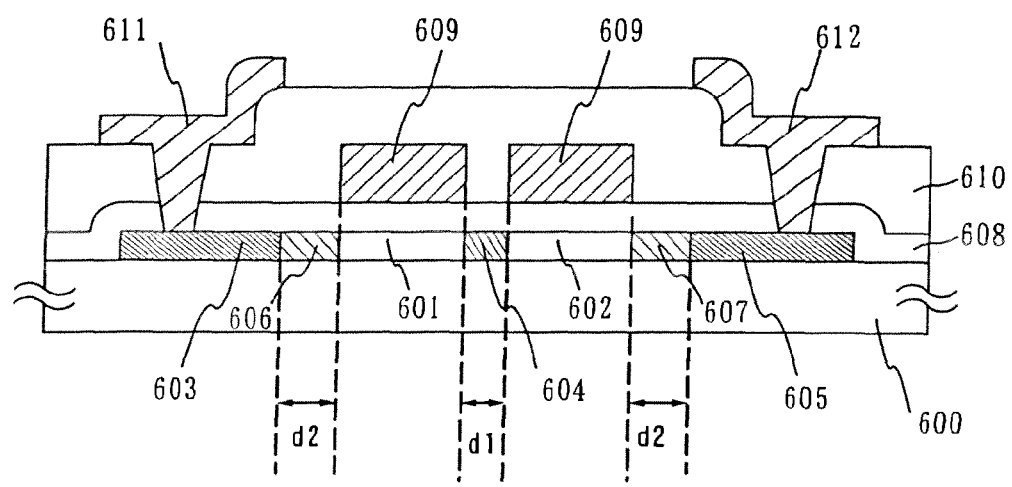
FIG. 17 is a cross sectional view according to the present invention (Embodiment 5)

In FIG. 16, reference numeral 500 denotes a substrate, 501 and 502 denote channel forming regions, 503 and 505 denote a source region and a drain region, 504 denotes a high concentration impurity region, 506 and 507 denote low concentration impurity regions (LDD regions), 508 denotes a gate insulating film, 509 denotes gate electrodes, 510 denotes an interlayer insulating film, and 511 and 512 denote a source electrode and a drain electrode.

In this embodiment, one more doping step is added and a concentration of an impurity included in the high concentration impurity region 504 is higher than that in one of the source region and the drain region 503 and 505. Since the region 504 sandwiched by the two channel forming regions has a higher concentration than one of the source region and the drain region 503 and 505, light sensitivity is reduced in the case of incidence light into a TFT for some reason while the resistance of the entire semiconductor layer of the TFT which is in an on state is reduced.

Note that, as in Embodiment Mode 1, only the high concentration impurity region 504 is formed as the region sandwiched by the two channel forming regions 501 and 502. In addition, as in Embodiment Mode 1, the interval d1 between the adjacent gate electrodes 509, that is, a width of the high concentration impurity region in a channel length direction is designed to be shorter than the width d2 of the low concentration impurity regions 506 and 507. Thus, the interval between the two channel forming regions can be shortened and an area occupied by the TFT in one pixel can be reduced.

Also, even when the interval d1 between the adjacent gate electrodes, that is, the width of the high concentration impurity region in a channel length direction is designed to be equal to the width d2 of the low concentration impurity regions in the TFT structure shown in FIG. 16, as in Embodiment Mode 2, an effect is obtained.

In FIG. 17, reference numeral 600 denotes a substrate, 601 and 602 denote channel forming regions, 603 and 605 denote a source region and a drain region, 604 denotes a high concentration impurity region, 606 and 607 denote low concentration impurity regions (LDD regions), 608 denotes a gate insulating film, 609 denotes gate electrodes, 610 denotes an interlayer insulating film, and 611 and 612 denote a source electrode and a drain electrode.

In this embodiment, one more doping step is added and a concentration of an impurity included in the high concentration impurity region 604 is higher than that in low concentration impurity regions 606 and 607 and lower than that in one of the source region and the drain region 603 and 605.

Note that, as in Embodiment Mode 1, only the high concentration impurity region 604 is formed as the region sandwiched by the two channel forming regions 601 and 602. In addition, as in Embodiment Mode 1, the interval d1 between the adjacent gate electrodes 609, that is, the width of the high concentration impurity region in a channel length direction is designed to be shorter than the width d2 of the low concentration impurity regions 606 and 607. Thus, the interval between the two channel forming regions can be shortened and an area occupied by the TFT in one pixel can be reduced.

Also, even when the interval d1 between the adjacent gate electrodes, that is, the width of the high concentration impurity region in the channel length direction is designed to be equal to the width d2 of the low concentration impurity regions in the TFT structure shown in FIG. 17, as in Embodiment Mode 2, an effect is obtained.

Note that this embodiment can be freely combined with any one of Embodiment Modes 1 to 4 and Embodiments 1 to 4. However, it is necessary to further add a doping step of adding an impurity element to a region between the two channel forming regions in the case of combining.

Embodiment 6

The TFT fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Embodiments of these are shown in FIGS. 18A to 18F, 19A to 19D and 20A to 20C.

Figure 18A:
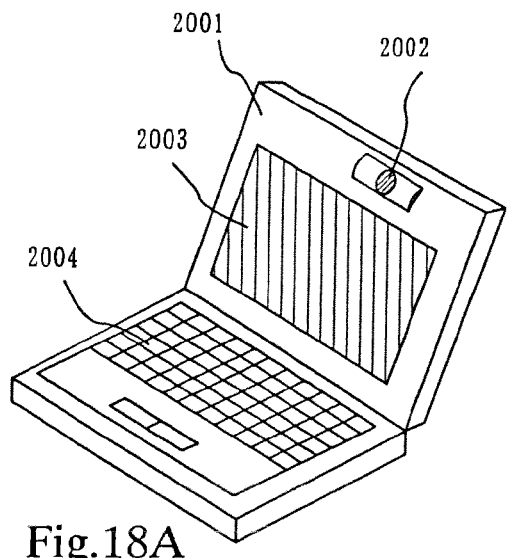
FIGS. 18A to 18F show examples of electronic devices.

FIG. 18A is a personal computer which comprises: a main body 2001; an image input section 2002; a display section 2003; and a keyboard 2004. The present invention can be applied to the display section 2003.

Figure 18B:
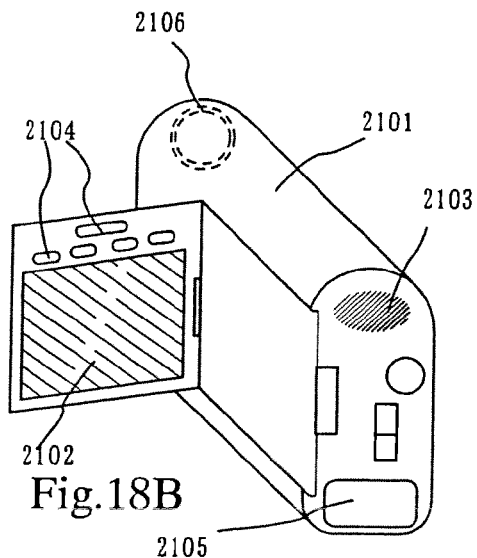

FIG. 18B is a video camera which comprises: a main body 2101; a display section 2102; a voice input section 2103; operation switches 2104; a battery 2105 and an image receiving section 2106. The present invention can be applied to the display section 2102.

Figure 18C:
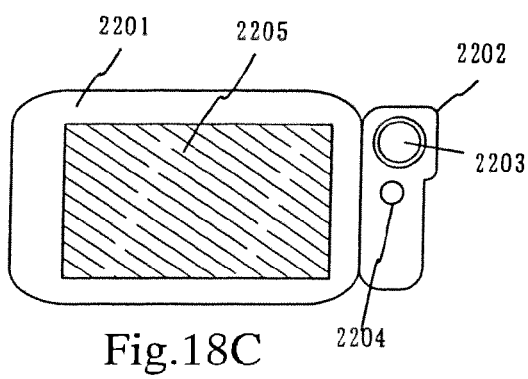

FIG. 18C is a mobile computer which comprises: a main body 2201; a camera section 2202; an image receiving section 2203; operation switches 2204 and a display section 2205. The present invention can be applied to the display section 2205.

Figure 18D:
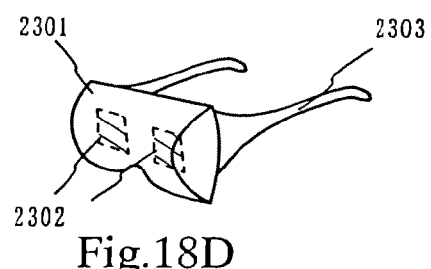

FIG. 18D is a goggle type display, which comprises: a main body 2301; a display section 2302; and an arm section 2303. The present invention can be applied to the display section 2302.

Figure 18E:
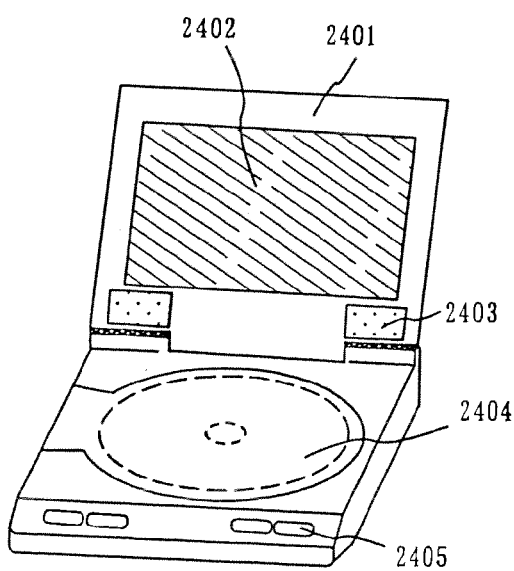

FIG. 18E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet. The present invention can be applied to the display section 2402.

Figure 18F:
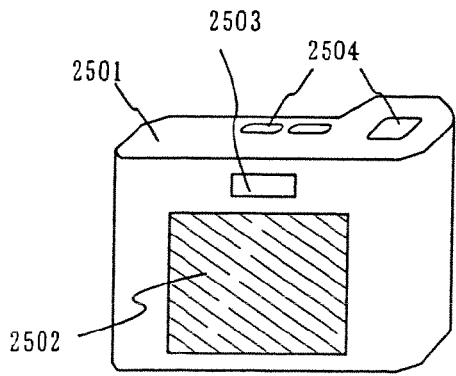

FIG. 18F is a digital camera which comprises: a main body 2501; a display section 2502; a view finder 2503; operation switches 2504; and an image receiving section (not shown in the figure). The present invention can be applied to the display section 2502.

Figure 19A:
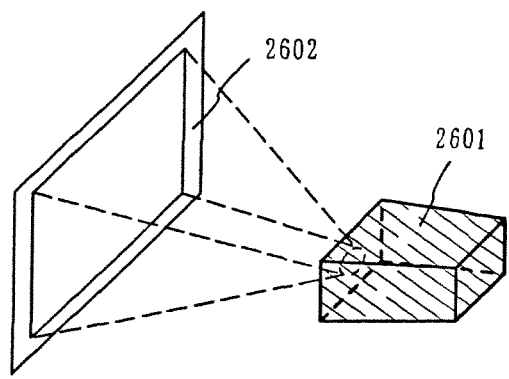
FIGS. 19A to 19D show examples of electronic devices.

FIG. 19A is a front type projector, which comprises: a projection system 2601; and a screen 2602. The present invention can be applied to the liquid crystal module 2808, which forms a part of the projection system 2601 to complete the whole system.

Figure 19B:
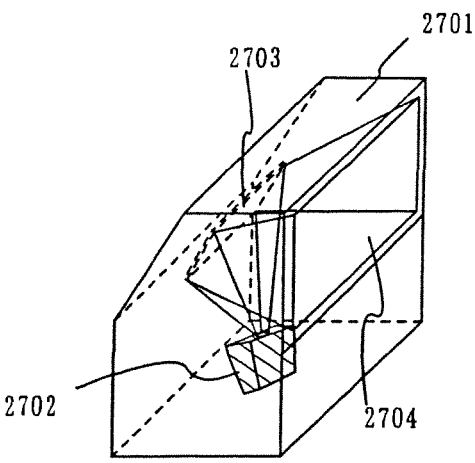

FIG. 19B is a rear type projector, which comprises: a main body 2701; a projection system 2702; a mirror 2703; and a screen 2704. The present invention can be applied to the liquid crystal module 2808, which forms a part of the projection system 2702 to complete the whole system.

Figure 19C:
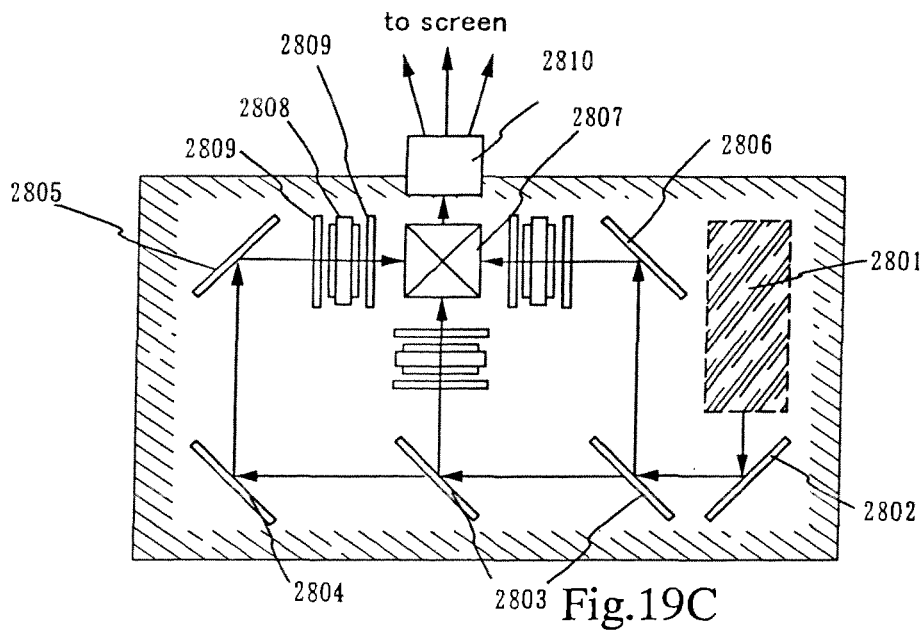

FIG. 19C is a diagram which shows an example of the structure of a projection system 2601 and 2702 in FIGS. 19A and 19B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc. in the optical path shown by an arrow in FIG. 19C.

Figure 19D:
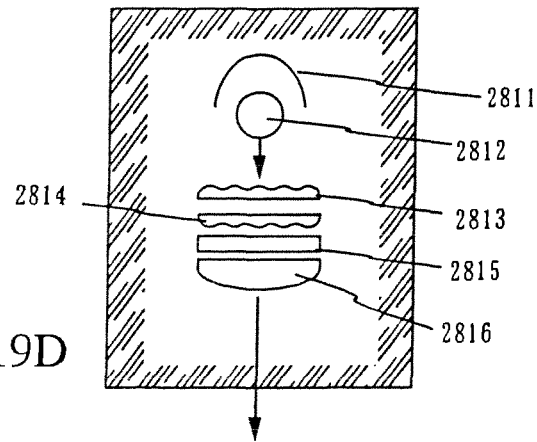

FIG. 19D is a diagram showing an example of a structure of an optical light source system 2801 in FIG. 19C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 19D is merely an example and the structure is not limited to this embodiment. For instance, an operator may appropriately dispose an optical lens, a film, which has a function to polarize light, a film that adjusts a phase difference or an IR film, etc.

Note that the projectors shown FIGS. 19A to 19D are the cases of using a transmission type electro-optical device, and applicable examples of a reflection type electro-optical device and an EL module are not shown.

Figure 20A:
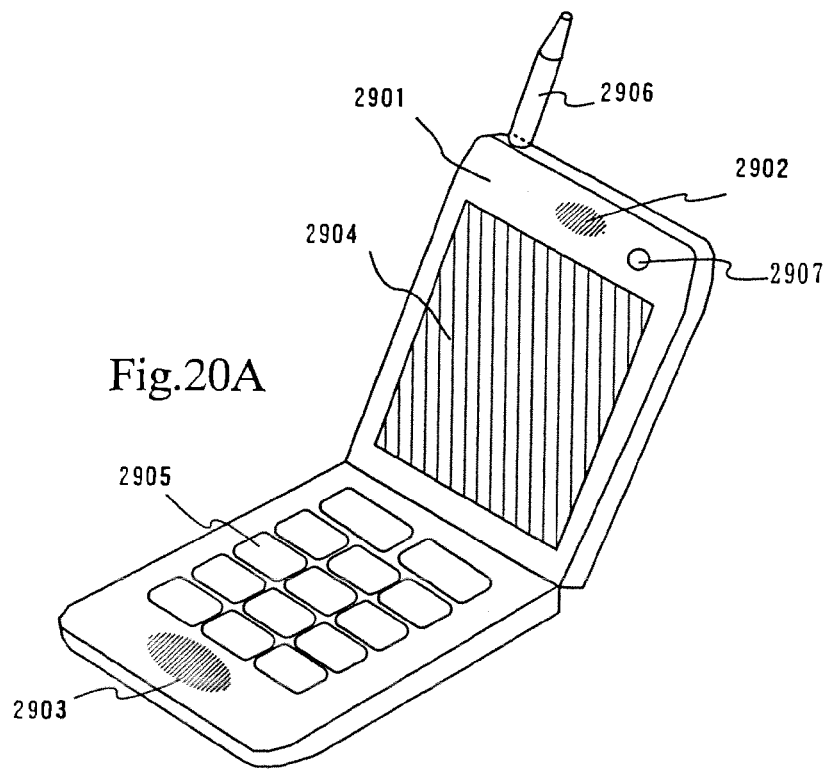
FIGS. 20A to 20C show examples of electronic devices.

FIG. 20A is a mobile phone which comprises: a main body 2901; a voice output section 2902; a voice input section 2903; a display section 2904; operation switches 2905; an antenna 2906; and an image input section (CCD, image sensor, etc.) 2907 etc. The present invention can be applied to the display section 2904.

Figure 20B:
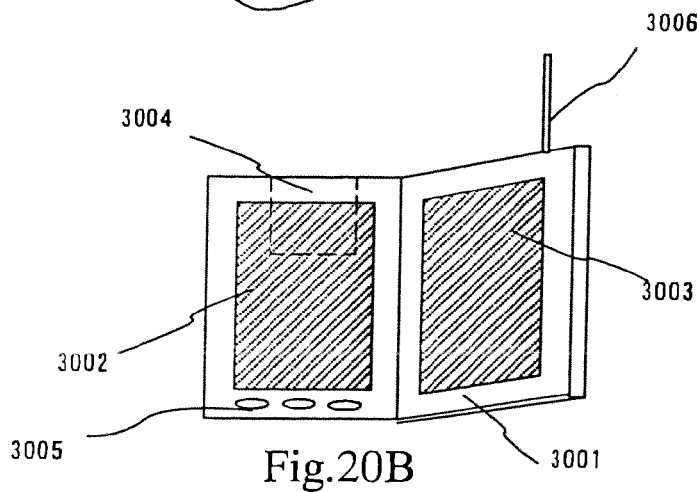

FIG. 20B is a portable book (electronic book) which comprises: a main body 3001; display sections 3002 and 3003; a recording medium 3004; operation switches 3005 and an antenna 3006 etc. The present invention can be applied to the display sections 3002 and 3003.

Figure 20C:
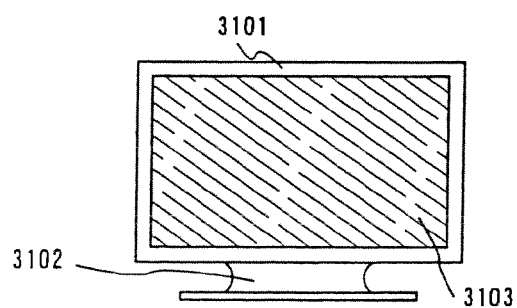

FIG. 20C is a display, which comprises: a main body 3101; a supporting section 3102; and a display section 3103 etc. The present invention can be applied to the display section 3103. In addition, the display shown in FIG. 20C is small and medium type of large type, for example, screen of the display sized 5 to 20 inches. Moreover, it is preferable to mass-produce to form such sized display section by executing a multiple pattern using a substrate sized 1×1 m.

As described above, the applicable range of the present invention is very large, and the invention can be applied to electronic apparatuses of various areas. Note that the electronic devices of this embodiment can be achieved by combining one of Embodiments Modes 1 to 4, and Embodiments 1 to 5.

Embodiment 7

In this embodiment, an example of steps of manufacturing an active matrix substrate, which are partly different from those in Embodiment 4, is indicated. Since steps up to the middle of a process are the same ones as Embodiment 4, the detail description is omitted here for simplification.

In accordance with Embodiment 4, an n-type or a p-type impurity element is added to the semiconductor layer at each concentration and then the third insulating layer which covers gate electrode and the capacitor wiring is formed. Here, a silicon oxide film is formed at a film thickness of 70 nm. Then, thermal treatment is performed for activating the n-type or p-type impurity element added to the semiconductor layer at each concentration. Here, the heat treatment is performed at 850° C. for 30 minutes.

Then, second light shielding layers 1417 and 1418 are formed. The second light shielding layers are formed of W, Ta, or Ti at a thickness of 100 nm to 150 nm. Such a degree of thickness is sufficient to obtain light shielding property and the thickness is determined in consideration of selectivity to a base insulating film in etching. In other words, when the light shielding layers are thick, overetching is required in consideration of a margin at etching. However, in this case, since the base insulating film is thinned in a region in which etching is rapidly progressed, it is not preferable. In addition, the second light shielding layers are in contact with the high concentration impurity regions of the semiconductor layer in the opening portions formed in the insulating film.

Next, hydrogenation processing is performed and then a fourth insulating layer 1419 of an organic resin material is formed. Here, an acrylic resin film with a film thickness of 400 nm is used. Next, contact holes which reach the second light shielding layers 1417 and 1418 are formed and then source and drain wirings 1420 and 1421 are formed. In this embodiment, a laminate film with a three-layer structure, which is obtained by forming a Ti film (100 nm), an aluminum film including Ti (300 nm), and a Ti film (150 nm) in succession by a sputtering method, is used for these wirings.

Figure 22A:
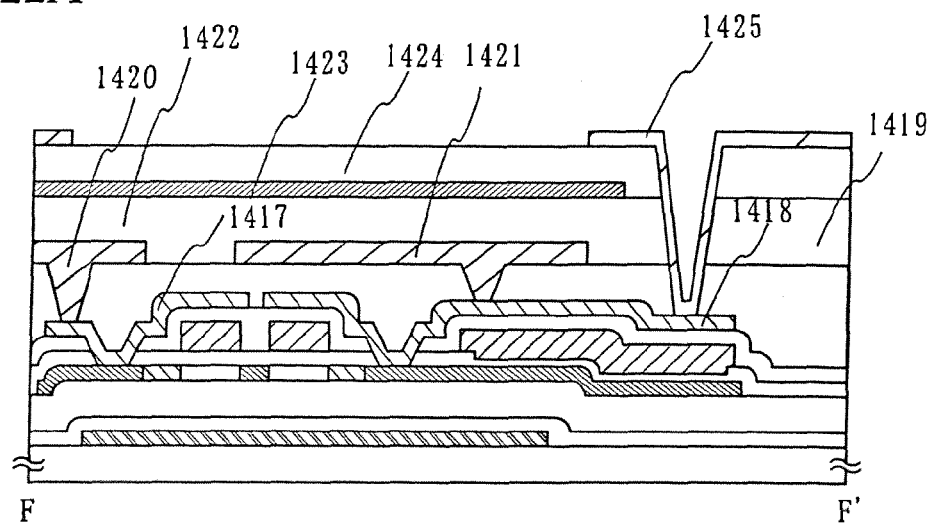
FIGS. 22A and 22B show steps of manufacturing an active matrix substrate (Embodiment 7)
Figure 22B:
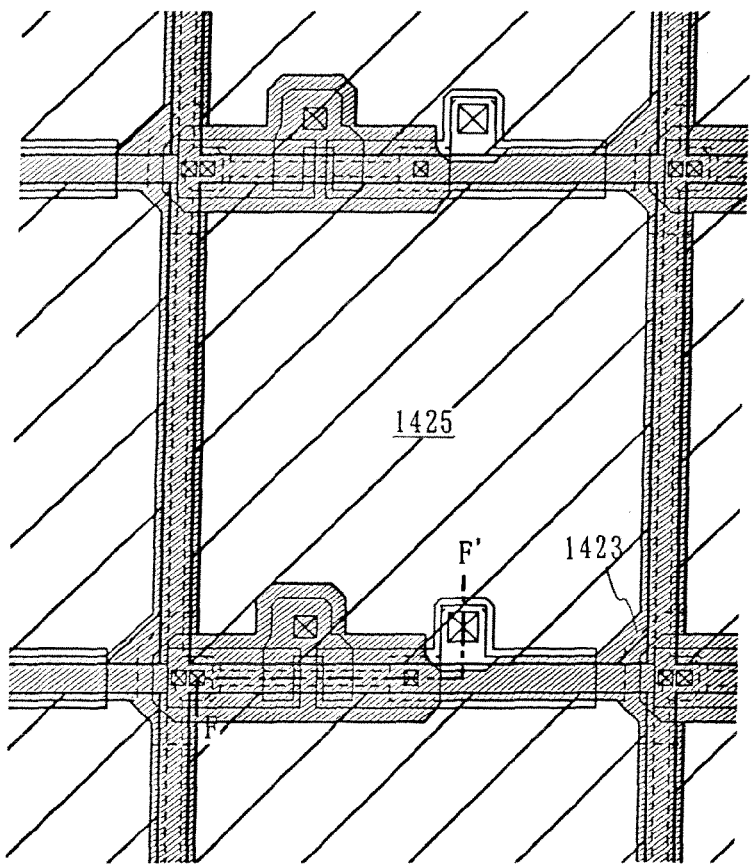

Next, as shown in FIG. 22A, a fifth insulating layer 1422 of acrylic is formed. A conductive layer of W, Ta, Ti, or the like is formed at a thickness of 100 nm on the fifth insulating layer 1422 to form a third light shielding layer 1423. Further, a sixth insulating layer 1424 is formed. Next, a contact hole which reaches the drain electrode is formed. A transparent conductive film (here, indium tin oxide (ITO) film) with a thickness of 100 nm is formed and then patterned to form a pixel electrode 1425. A cross sectional view taken along the dotted line F-F' in FIG. 22B corresponds to FIG. 22A.

Thus, in the pixel portion, while an area (aperture ratio of 74.5%) of a display region (pixel size of 23 μm×23 μm) is kept, the n-channel TFT is formed and a sufficient storage capacitor (55.2 fF) can be obtained.

Also, although the example, in which the active matrix substrate for the transmission liquid crystal display device is manufactured using the transparent conductive film for the pixel electrode, is indicated in this embodiment, an active matrix substrate for a reflection liquid crystal display may be manufactured device using a material film having reflection property for the pixel electrode.

Also, this embodiment can be freely combined with any one of Embodiment Mode 1 to Embodiment Mode 4 and Embodiment 1 to Embodiment 6.

Embodiment 8

In this embodiment, manufacturing steps of forming an active matrix substrate in accordance with Embodiment Mode 4 is indicated.

First, as Embodiment Mode 4, the conductive film is formed on the substrate with an insulating surface and patterned to form the first light shielding layer. The first light shielding layer is patterned to also serve as a scan line.

The first light shielding layer serves as a light shielding layer for protecting an active layer formed later from light. Here, a quartz substrate is used as the substrate and a laminate structure of a polysilicon film (film thickness of 50 nm) and a tungsten silicide (W—Si) film (film thickness of 100 nm) is used for the first light shielding layer. The polysilicon film protects the substrate from a contamination of tungsten silicide. In addition to a quartz substrate, a glass substrate or a plastic substrate can be used as the substrate. When a glass substrate is used, thermal treatment may be performed in advance at a lower temperature than a glass distortion point by about 10° C. to 20° C. In addition, in order to prevent impurity diffusion from the substrate, a base film of an insulating film such as a silicon oxide film, a silicon nitride film, or a silicon oxynitride film is preferably formed on the surface of the substrate over which a TFT is formed. Polycrystalline silicon doped with an impurity element for providing a conductivity type, a conductive material such as WSix (x=2.0 to 2.8), Al, Ta, W, Cr, Mo, or the like, or a laminate structure thereof can be used for the first light shielding film.

Next, an insulating film for covering the first light shielding layer (first insulating layer) is formed at a film thickness of 100 nm to 1000 nm (typically, 300 nm to 500 nm). Here, a silicon oxide film with a film thickness of 100 nm using a CVD method and a silicon oxide film with a film thickness of 280 nm using an LPCVD method are laminated.

Also, after forming the insulating film, leveling may be performed by processing or the like with chemically and mechanically polishing an insulating surface (typically, a CMP technique). For example, polishing is conducted in order that a maximum height in the surface of the insulating film (Rmax) is 0.5 μm or lower, preferably, 0.3 μm or lower.

Next, a first amorphous semiconductor film is formed at a film thickness of 10 nm to 100 nm. Here, an amorphous silicon film is formed at a film thickness of 69 nm by using an LPCVD method. The amorphous silicon film can also be formed by using a sputtering method, a plasma CVD method, or the like as another means. Next, a first crystalline semiconductor film is formed by crystallization using a technique described in JP 08-78329 A as a technique for crystallizing the first amorphous semiconductor film. According to this crystallization method, a metallic element for promoting crystallization is selectively added to an amorphous silicon film and then thermal treatment is performed to form a crystalline semiconductor film in which crystallization is expanded from an added region as a start point. Here nickel is used as the metallic element for promoting crystallization and thermal treatment for crystallization (at 600° C. for 8 hours) is performed after thermal treatment for dehydrogenation (at 450° C. for 1 hour) is performed. Of course, crystallization is not limited to the technique described in the above document and known crystallization processing can be used.

Next, nickel is gettered from a region as an active layer of a TFT. Here, an example of a gettering method, in which gettering is performed using an amorphous semiconductor film including a noble gas, is indicated. The surface is processed with ozone water for 120 seconds to form a barrier layer of the oxide film with a thickness of 1 nm to 5 nm. Then, an amorphous silicon film including an argon element is formed as a gettering cite at a film thickness of 150 nm on the barrier layer by a sputtering method. With respect to a film formation condition in the sputtering method of this embodiment, a film formation pressure is set to be 0.3 Pa, a flow rate of gas (Ar) is set to be 50 (sccm), film formation power is set to be 3 kW, and a substrate temperature is set to be 150° C. Note that an atomic concentration of an argon element included in the amorphous silicon film in the above condition is $3\times10^{20}/cm^3$ to $6\times10^{20}/cm^3$ and an atomic concentration of oxygen is $1\times10^{19}/cm^3$ to $3\times10^{19}/cm^3$. Thereafter, thermal treatment at 650° C. for 3 minutes is performed for gettering with a lamp anneal apparatus. Note that an electrical furnace may be used instead of the lamp anneal apparatus.

Next, the amorphous silicon film including an argon element as the gettering cite is selectively removed using the barrier layer as an etching stopper and then the barrier layer is selectively removed using diluted hydrofluoric acid. Note that, it is desirable that the barrier layer of the oxide film is removed after gettering since nickel tends to easily move to a region with a high oxygen concentration in gettering.

Next, a second amorphous silicon film is formed at a thickness of 10 nm to 200 nm on the first crystalline semiconductor film for which gettering processing has been completed. The second amorphous silicon film is crystallized by irradiation of continuous oscillating laser light to become a second crystalline semiconductor film.

For example, when a TFT is manufactured from the first crystalline semiconductor film, the mobility is about 300 $cm^2/Vs$. On the other hand, when a TFT is manufactured from the second crystalline semiconductor film, the mobility is about 500 to 600 $cm^2/Vs$ and markedly improved.

In addition, the first crystalline semiconductor film serves as a protective film when laser is irradiated to the second amorphous silicon film. Thus, there is an effect that stress to the base film is relaxed.

With respect to the active layer with a laminate structure of the first crystalline semiconductor film and the second crystalline semiconductor film, a thin oxide film is formed on the surface of the active layer by ozone water, a mask of resist is formed and the active layer is processed by etching into a predetermined shape to form island-like separated active layers. After forming the island-like separated active layers, the mask of a resist is removed.

The following steps may be conducted in accordance with Embodiment Mode 4 to form TFTs, thereby completing the active matrix substrate.

Also, this embodiment can be freely combined with any one of Embodiment Mode 1 to Embodiment Mode 4 and Embodiment 1 to Embodiment 7.

Embodiment 9

In this embodiment, an example in which the first amorphous semiconductor film is crystallized by a different method from Embodiment 8 will be indicated.

In accordance with Embodiment 8, the first amorphous silicon film is formed on the base insulating film. Then, thermal treatment is performed in a nitrogen atmosphere at 600° C. for 24 hours. It may also be directly formed by using the LPCVD method. A crystalline semiconductor film formed in this embodiment has a smaller crystal grain size than the crystalline semiconductor film formed in Embodiment 8.

Subsequently, a second amorphous silicon film is formed at a thickness of 10 nm to 200 nm on the crystalline semiconductor film. The second amorphous silicon film is crystallized by using continuous oscillating laser light to become a second crystalline semiconductor film. The second crystalline semiconductor film obtained in this embodiment has the same characteristic as the second crystalline semiconductor film obtained in Embodiment 8. Thus, the crystalline semiconductor film composing a TFT with a superior electrical characteristic can be formed.

Also, this embodiment can be freely combined with any one of Embodiment Mode 1 to Embodiment Mode 4 and Embodiment 1 to Embodiment 7.

According to the present invention, an occupying area of a TFT in one pixel can be reduced to improve an aperture ratio of the pixel. Also, according to the present invention, a deterioration of the TFT characteristic by incidence light into a TFT due to various factors (natural light, multiple reflection, diffraction light, light from a light source, return light, and the like) can be suppressed. Further, according to the present invention, it can be progressed to reduce a pitch of respective display pixels with increasing a definition (increasing the number of pixels) of the liquid crystal display device and miniaturizing the liquid crystal display device.

What is claimed is:

1. A semiconductor device comprising:
a substrate;
a light-shielding layer;
a first insulating layer over the light-shielding layer;
a semiconductor layer over the first insulating layer, the semiconductor layer comprising a first channel forming region and a second channel forming region;
a gate insulating layer over the semiconductor layer;

a gate electrode over the gate insulating layer;
a second insulating layer over the gate electrode;
a source electrode and a drain electrode over the second insulating layer;
a third insulating layer over the source electrode and the drain electrode;
a fourth insulating layer over the third insulating layer; and
a pixel electrode over the fourth insulating layer,
wherein the light-shielding layer, the first channel forming region, the gate electrode, and one of the source electrode and the drain electrode each overlap a first region of the substrate,
wherein the light-shielding layer, the second channel forming region, and the gate electrode each overlap a second region of the substrate,
wherein the semiconductor layer comprises a first region located between the first and the second channel forming regions,
wherein the light-shielding layer, the first region of the semiconductor layer, and the one of the source electrode and the drain electrode, each overlap a third region of the substrate,
wherein the semiconductor layer comprises a region not overlapping the light-shielding layer,
wherein the source electrode and the drain electrode are each in electrical contact with the semiconductor layer, and
wherein the pixel electrode is in electrical contact with the semiconductor layer.

2. A semiconductor device comprising:
a substrate;
a first conductive layer;
a first insulating layer over the first conductive layer;
a semiconductor layer over the first insulating layer, the semiconductor layer comprising a first channel forming region and a second channel forming region;
a gate insulating layer over the semiconductor layer;
a gate electrode over the gate insulating layer;
a second insulating layer over the gate electrode;
a second conductive layer over the second insulating layer;
a third insulating layer over the second conductive layer;
a third conductive layer over the third insulating layer;
a fourth insulating layer over the third conductive layer; and
a pixel electrode over the fourth insulating layer,
wherein the first conductive layer, the first channel forming region, the gate electrode, the second conductive layer, and the third conductive layer each overlap a first region of the substrate,
wherein the first conductive layer, the second channel forming region, and the gate electrode each overlap a second region of the substrate,
wherein the semiconductor layer comprises a first region located between the first and the second channel forming regions,
wherein the first conductive layer, the first region of the semiconductor layer, the second conductive layer, and the third conductive layer each overlap a third region of the substrate,
wherein the semiconductor layer comprises a region not overlapping the first conductive layer,
wherein the second conductive layer is in electrical contact with the semiconductor layer, and
wherein the pixel electrode is in electrical contact with the semiconductor layer.

3. A semiconductor device comprising:
a substrate;
a first conductive layer;
a first insulating layer over the first conductive layer;
a semiconductor layer over the first insulating layer, the semiconductor layer comprising a first channel forming region and a second channel forming region;
a gate insulating layer over the semiconductor layer;
a gate electrode over the gate insulating layer;
a second insulating layer over the gate electrode;
a second conductive layer over the second insulating layer;
a third insulating layer over the second conductive layer;
a third conductive layer over the third insulating layer;
a fourth insulating layer over the third conductive layer; and
a pixel electrode over the fourth insulating layer,
wherein the first conductive layer, the first channel forming region, the gate electrode, the second conductive layer, and the third conductive layer each overlap a first region of the substrate,
wherein the first conductive layer, the second channel forming region, and the gate electrode each overlap a second region of the substrate,
wherein a first region of the semiconductor layer, located between the first and the second channel forming regions, is doped at a first concentration,
wherein the first conductive layer, the first region of the semiconductor layer, the second conductive layer, and the third conductive layer each overlap a third region of the substrate,
wherein a second region and a third region of the semiconductor layer, sandwiching the first and the second channel forming regions, are doped at a second and a third concentration, respectively, the second and the third concentrations being lower than the first concentration,
wherein an entirety of the second region of the semiconductor layer and an entirety of the third region of the semiconductor layer each overlap with the first conductive layer,
wherein a fourth region of the semiconductor layer and the first conductive layer do not overlap,
wherein the second conductive layer is in electrical contact with the semiconductor layer, and
wherein the pixel electrode is in electrical contact with the semiconductor layer.

4. The semiconductor device according to claim 2, wherein the first region of the semiconductor layer is in direct contact with the first channel forming region.

5. The semiconductor device according to claim 3, wherein the first region of the semiconductor layer is in direct contact with the first channel forming region.

6. The semiconductor device according to claim 1, wherein the light-shielding layer is in electrical contact with the gate electrode.

7. The semiconductor device according to claim 2, wherein the first conductive layer is in electrical contact with the gate electrode.

8. The semiconductor device according to claim 3, wherein the first conductive layer is in electrical contact with the gate electrode.

9. The semiconductor device according to claim 1, wherein the pixel electrode is in electrical contact with the semiconductor layer via the one of the source electrode and the drain electrode.

10. The semiconductor device according to claim 2, wherein the pixel electrode is in electrical contact with the semiconductor layer via the second conductive layer.

11. The semiconductor device according to claim 3, wherein the pixel electrode is in electrical contact with the semiconductor layer via the second conductive layer.

12. The semiconductor device according to claim 1, wherein the third insulating layer is an organic layer.

13. The semiconductor device according to claim 2, wherein the third insulating layer is an organic layer.

14. The semiconductor device according to claim 3, wherein the third insulating layer is an organic layer.

15. An electronic apparatus comprising the semiconductor device according to claim 1.

16. An electronic apparatus comprising the semiconductor device according to claim 2.

17. An electronic apparatus comprising the semiconductor device according to claim 3.

* * * * *